US009385245B2

(12) United States Patent
Afzali-Ardakani et al.

(10) Patent No.: US 9,385,245 B2
(45) Date of Patent: Jul. 5, 2016

(54) GATE TUNABLE TUNNEL DIODE

(71) Applicant: GLOBALFOUNDRIES INC., Grand Cayman (KY)

(72) Inventors: Ali Afzali-Ardakani, Ossining, NY (US); Damon Farmer, White Plains, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 48 days.

(21) Appl. No.: 14/575,311

(22) Filed: Dec. 18, 2014

(65) Prior Publication Data
US 2015/0102289 A1 Apr. 16, 2015

Related U.S. Application Data

(63) Continuation of application No. 13/597,610, filed on Aug. 29, 2012, now Pat. No. 8,957,463, which is a continuation of application No. 13/594,037, filed on Aug. 24, 2012, now Pat. No. 8,735,271.

(51) Int. Cl.
| H01L 29/88 | (2006.01) |
| H01L 21/329 | (2006.01) |
| H01L 29/66 | (2006.01) |
| H01L 29/45 | (2006.01) |
| H01L 29/68 | (2006.01) |
| H01L 29/73 | (2006.01) |
| H01L 29/16 | (2006.01) |
| H01L 29/08 | (2006.01) |

(52) U.S. Cl.
CPC ............... *H01L 29/88* (2013.01); *H01L 29/45* (2013.01); *H01L 29/66037* (2013.01); *H01L 29/66151* (2013.01); *H01L 29/66356* (2013.01); *H01L 29/66977* (2013.01); *H01L 29/68* (2013.01); *H01L 29/7311* (2013.01); *H01L 29/0895* (2013.01); *H01L 29/1606* (2013.01)

(58) Field of Classification Search
CPC . H01L 29/7311; H01L 29/0895; H01L 29/43; H01L 29/66151; H01L 29/68; H01L 29/88
See application file for complete search history.

(56) References Cited

U.S. PATENT DOCUMENTS

| 6,177,702 | B1 | 1/2001 | Kakoschke |
| 6,855,587 | B2 | 2/2005 | Chi |
| 7,262,991 | B2 | 8/2007 | Zhang et al. |
| 7,858,989 | B2 | 12/2010 | Chen et al. |
| 8,101,980 | B2 | 1/2012 | Heo et al. |
| 2007/0014151 | A1 | 1/2007 | Zhang et al. |

(Continued)

OTHER PUBLICATIONS

International Application No. PCT/US 13/47233 filed Jun. 24, 2013; Notification of Transmittal of The International Search Report and The Written Opinion of the International Searching Authority, or the Declaration; dated Nov. 22, 2013; 6 pages.
International Application No. PCT/US 13/47233 filed Jun. 24, 2013; Written Opinion of the International Searching Authority; dated Nov. 22, 2013; 5 pages.
L. Britnell et al., "Field-Effect Tunneling Transistor Based on Vertical Graphene Heterostructures," Science 335, 947 (2012); DOI: 10.1126/Science.1218461; 5 pages.
Mark C. Lonergan, "A Tunable Diode Based on a Inorganic Semiconductor/Conjugated Polymer Interface," www.sciencemag.org, Science, vol. 278, Dec. 19, 1997, 5 pages.

(Continued)

*Primary Examiner* — Michele Fan
(74) *Attorney, Agent, or Firm* — Yuanmin Cai; Andrew M. Calderon; Roberts Mlotkowski Safran Cole & Calderon, P.C.

(57) ABSTRACT

A gate tunable diode is provided. The gate tunable diode includes a gate dielectric formed on a gate electrode and a graphene electrode formed on the gate dielectric. Also, the gate tunable diode includes a tunnel dielectric formed on the graphene electrode and a tunnel electrode formed on the tunnel dielectric.

20 Claims, 26 Drawing Sheets

(56) References Cited

U.S. PATENT DOCUMENTS

| | | | |
|---|---|---|---|
| 2008/0012462 A1* | 1/2008 | Yamage | 313/310 |
| 2008/0122519 A1 | 5/2008 | Nowak et al. | |
| 2010/0090265 A1* | 4/2010 | Bhattacharyya et al. | 257/315 |
| 2010/0127243 A1 | 5/2010 | Banerjee et al. | |
| 2011/0114918 A1 | 5/2011 | Lin et al. | |
| 2011/0278545 A1 | 11/2011 | Voutilainen et al. | |
| 2012/0112250 A1 | 5/2012 | Chung et al. | |
| 2012/0168722 A1 | 7/2012 | Chung et al. | |
| 2012/0235119 A1 | 9/2012 | Babich et al. | |
| 2012/0248414 A1 | 10/2012 | Kim et al. | |
| 2012/0256167 A1 | 10/2012 | Heo et al. | |
| 2012/0305891 A1 | 12/2012 | Nayfeh et al. | |
| 2012/0325296 A1 | 12/2012 | Woo et al. | |
| 2013/0015429 A1* | 1/2013 | Hong et al. | 257/29 |
| 2013/0256629 A1 | 10/2013 | Lee et al. | |
| 2014/0008616 A1 | 1/2014 | Geim et al. | |

OTHER PUBLICATIONS

Shannon W. Boettcher et al., "Tunable Electronic Interfaces Between Bulk Semiconductors and Ligand-Stabilized Nanoparticle Assemblies," Nature Materials, vol. 6, Aug. 2007, published online: www.nature.com/naturematerials; doi:10.1038/nmat1943; 5 pages.

Wolfgang Mehr, et al., "Vertical Graphene Base Transistor," IEEE Electron Device Letters, vol. 33, No. 5, May 2012, 3 pages.

International Application No. PCT/US2013/047233, International Filing Date: Jun. 24, 2013, International Preliminary Report on Patentability; Date of Issuance of this report Feb. 24, 2015; pp. 1-6.

International Application No. PCT/US2013/047233, International Filing Date: Jun. 24, 2013; Notification Concerning Transmittal of International Preliminary Report on Patentability date of Mailing Mar. 5, 2015; 1 page.

* cited by examiner

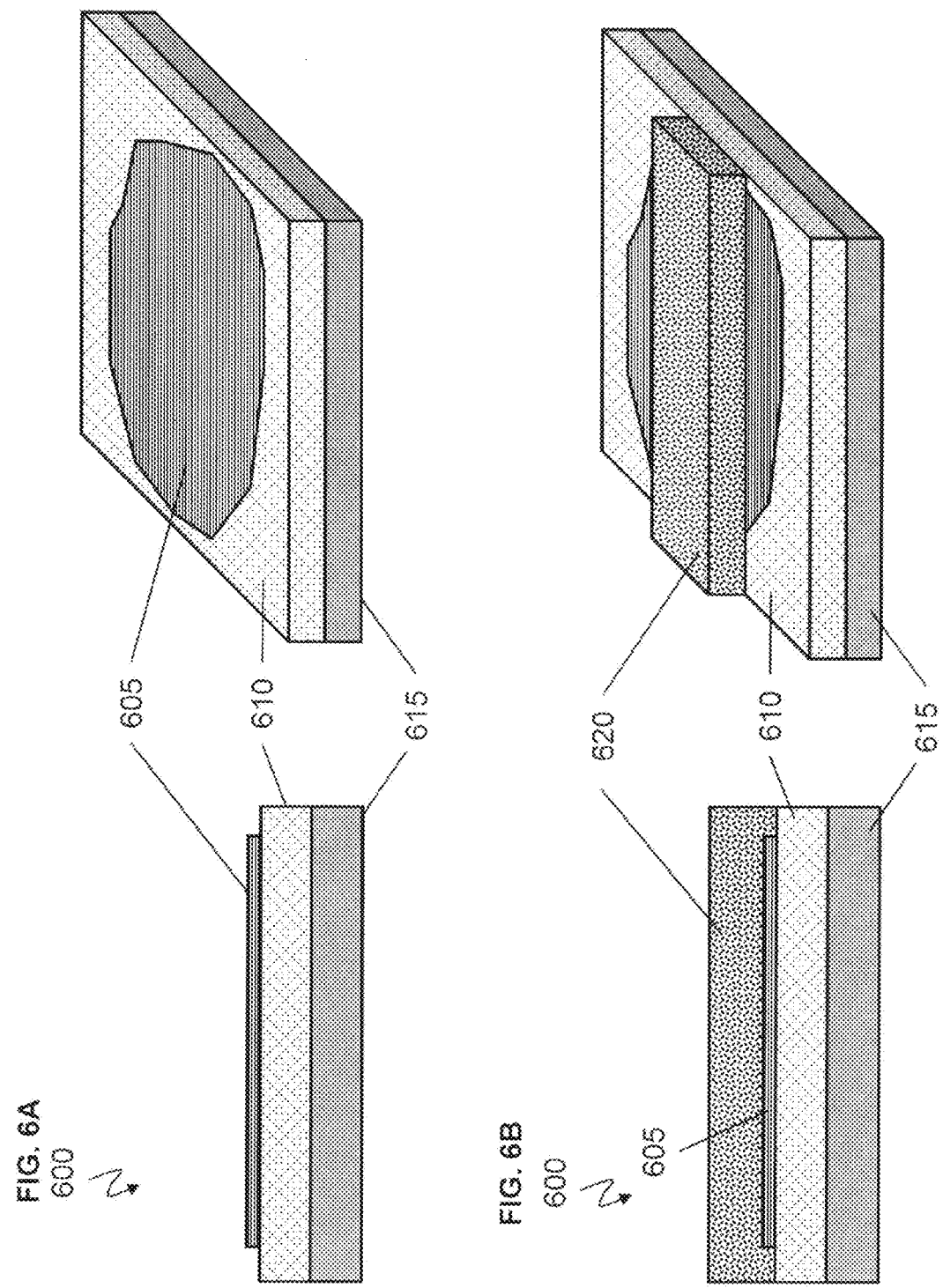

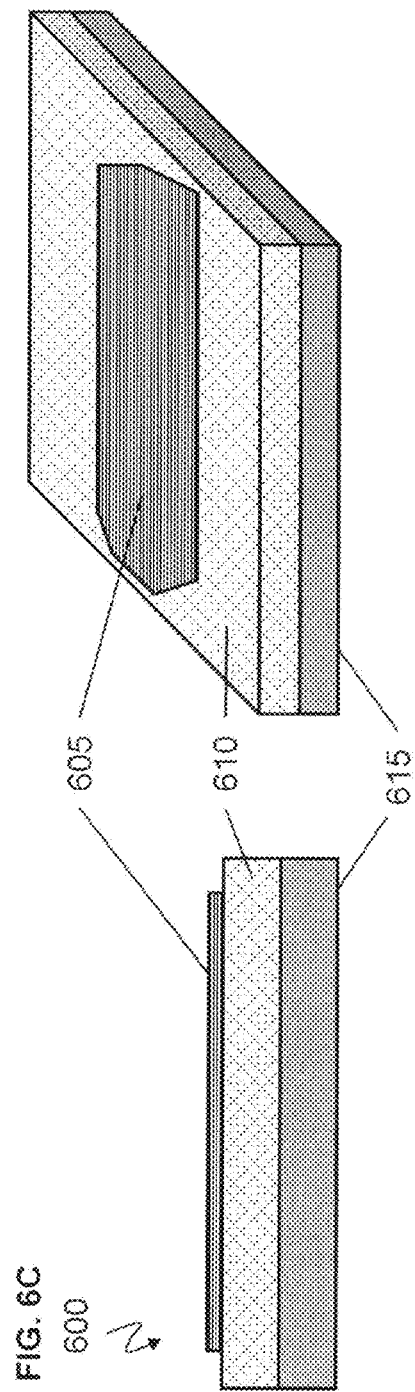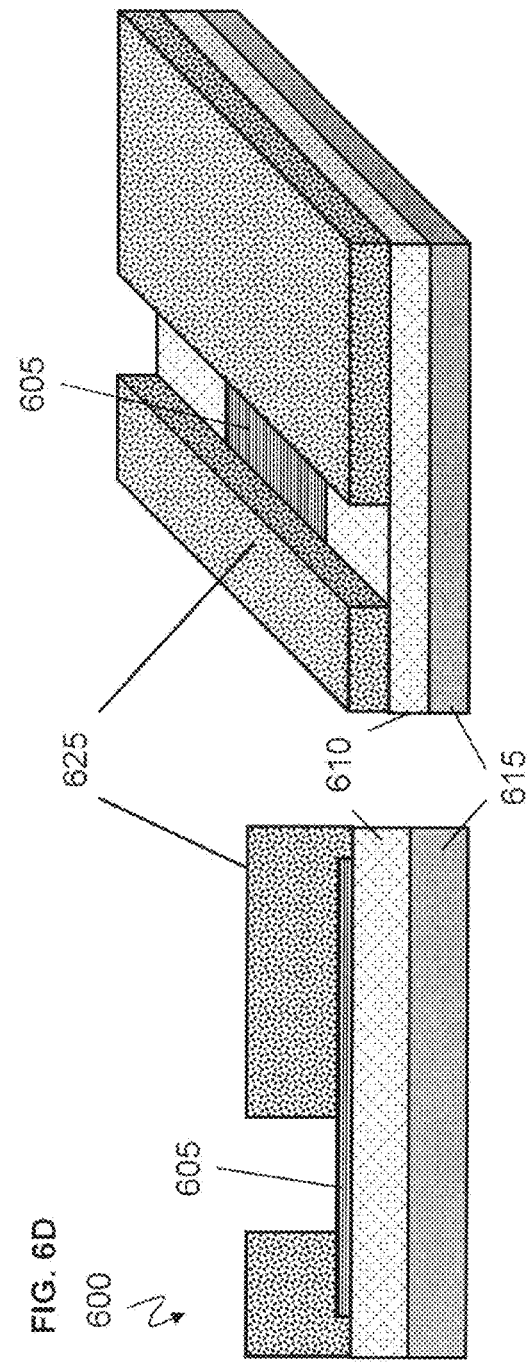

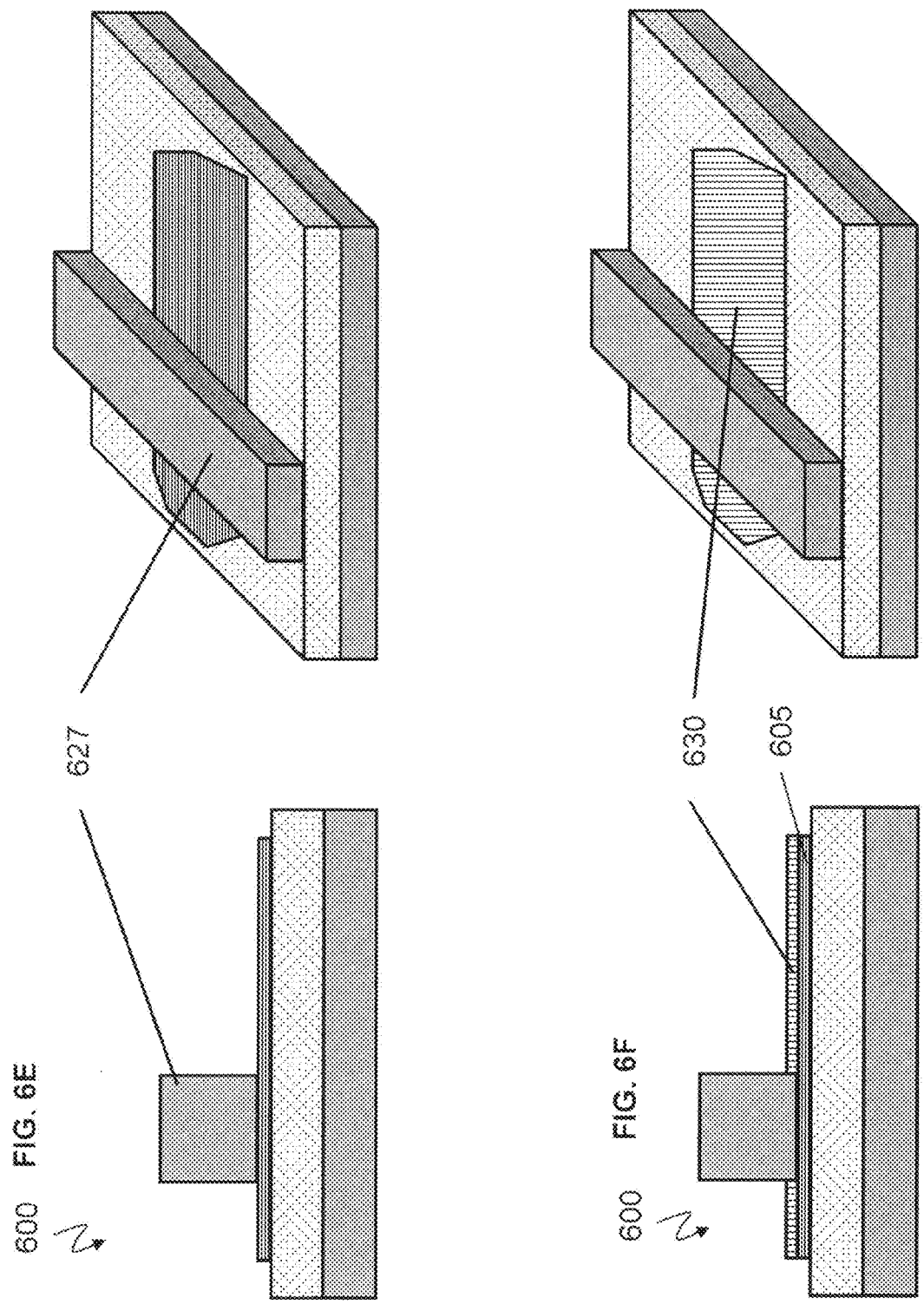

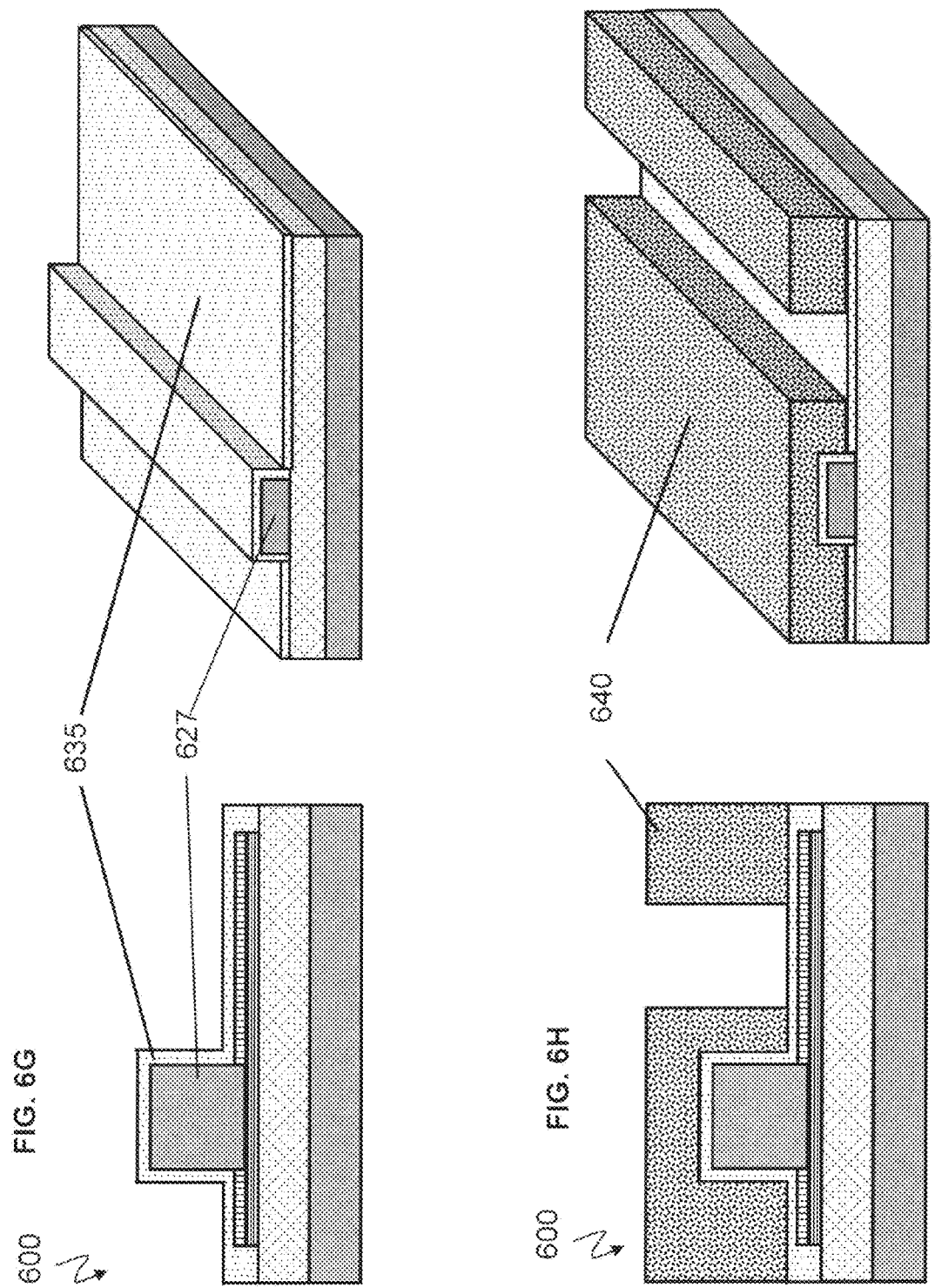

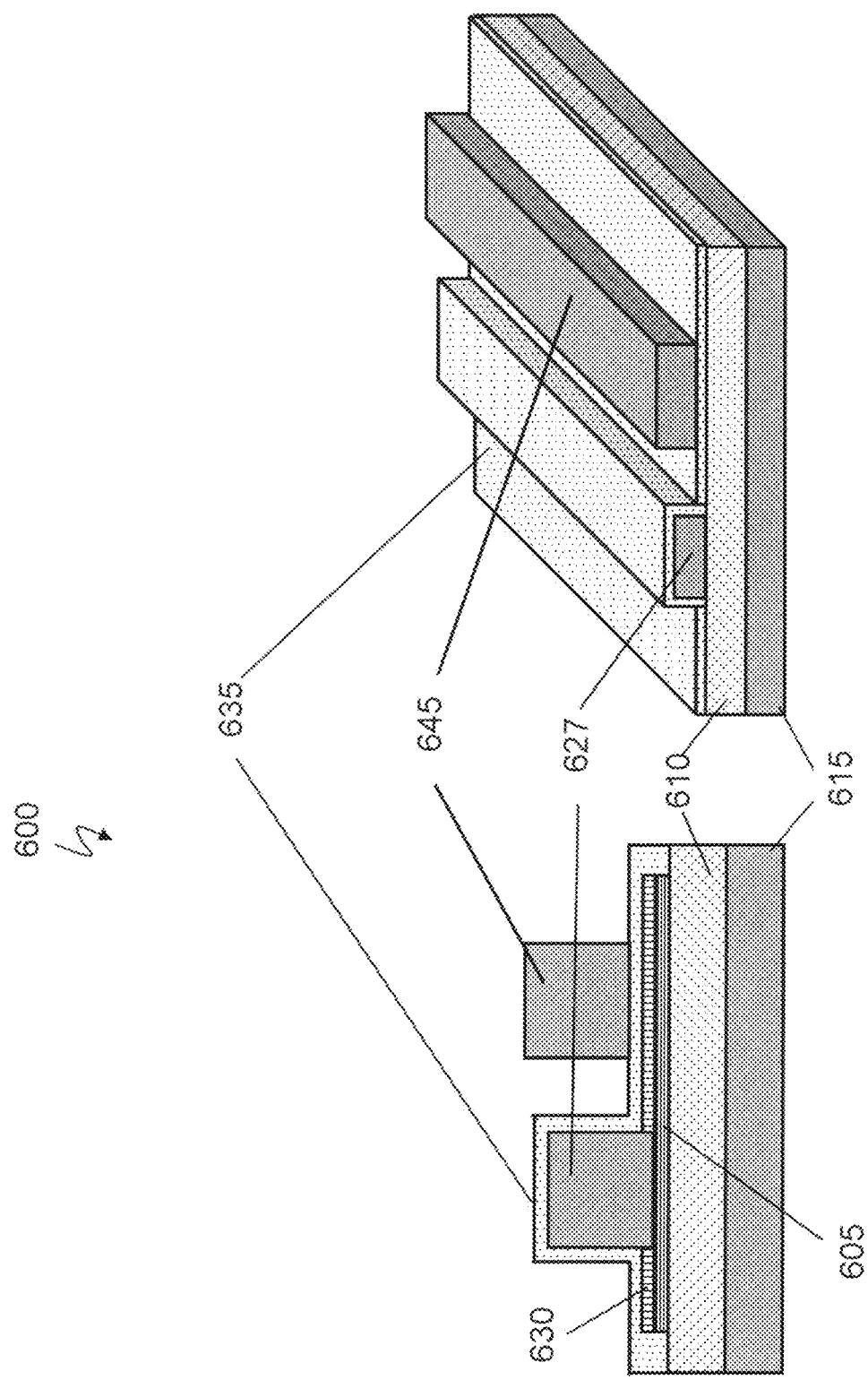

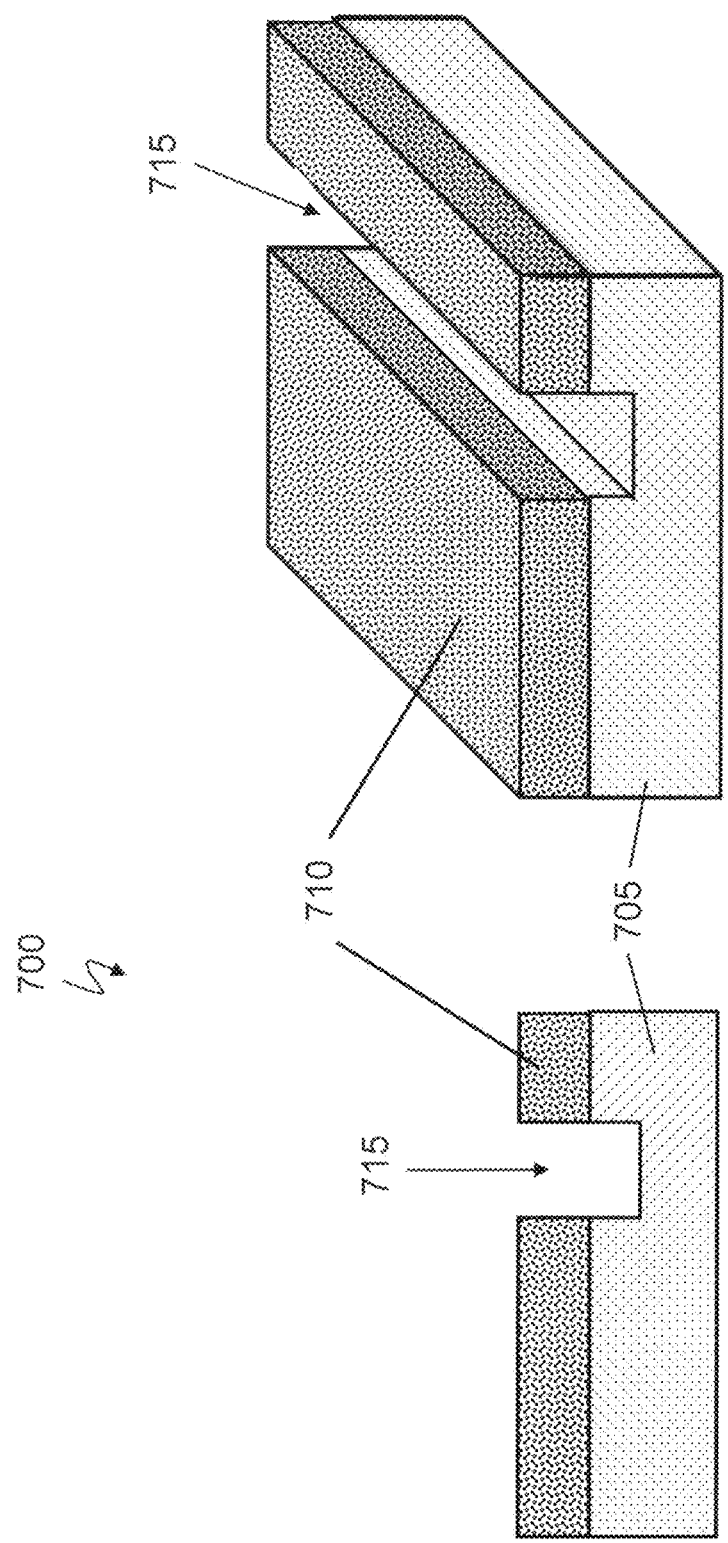

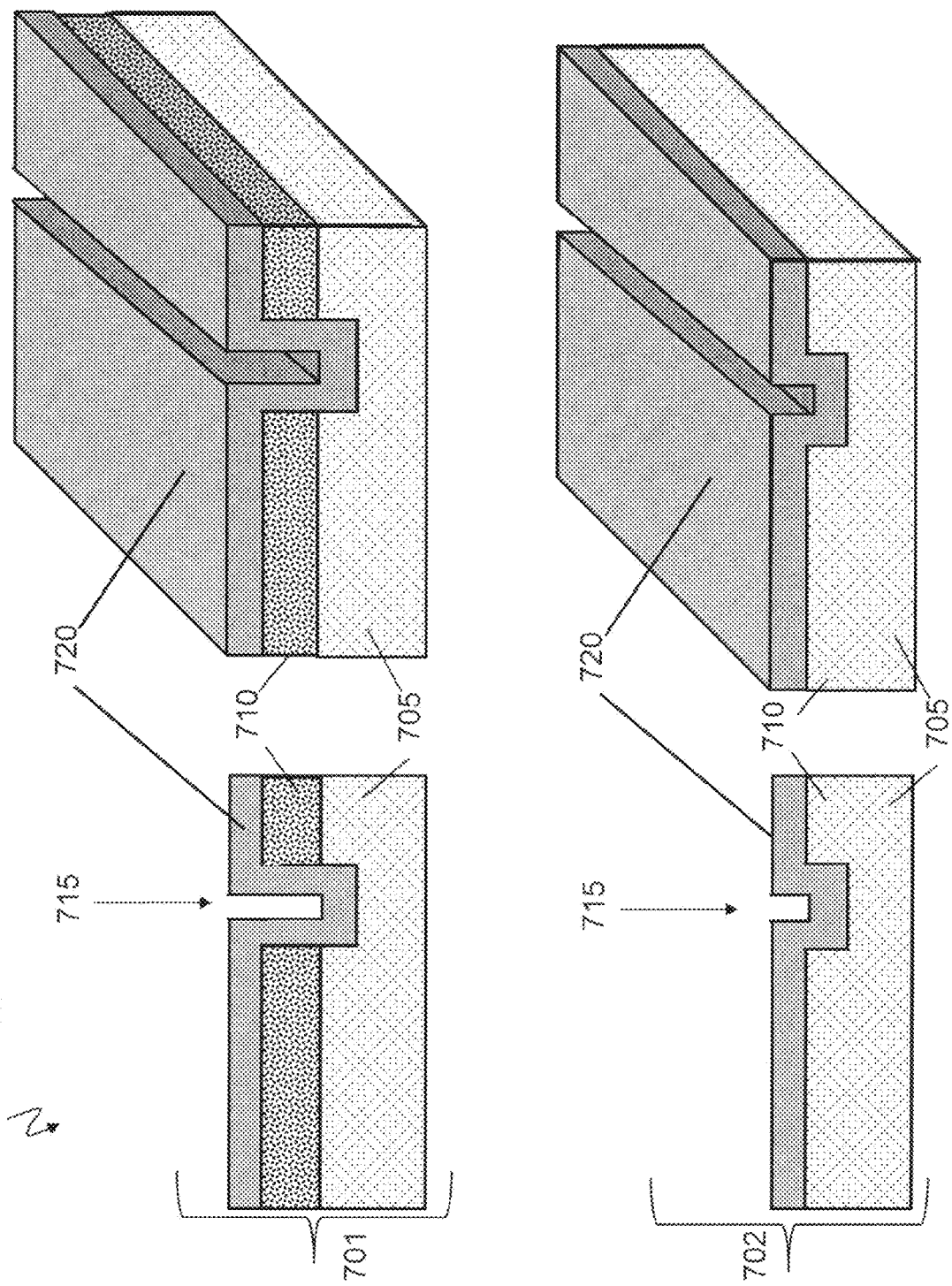

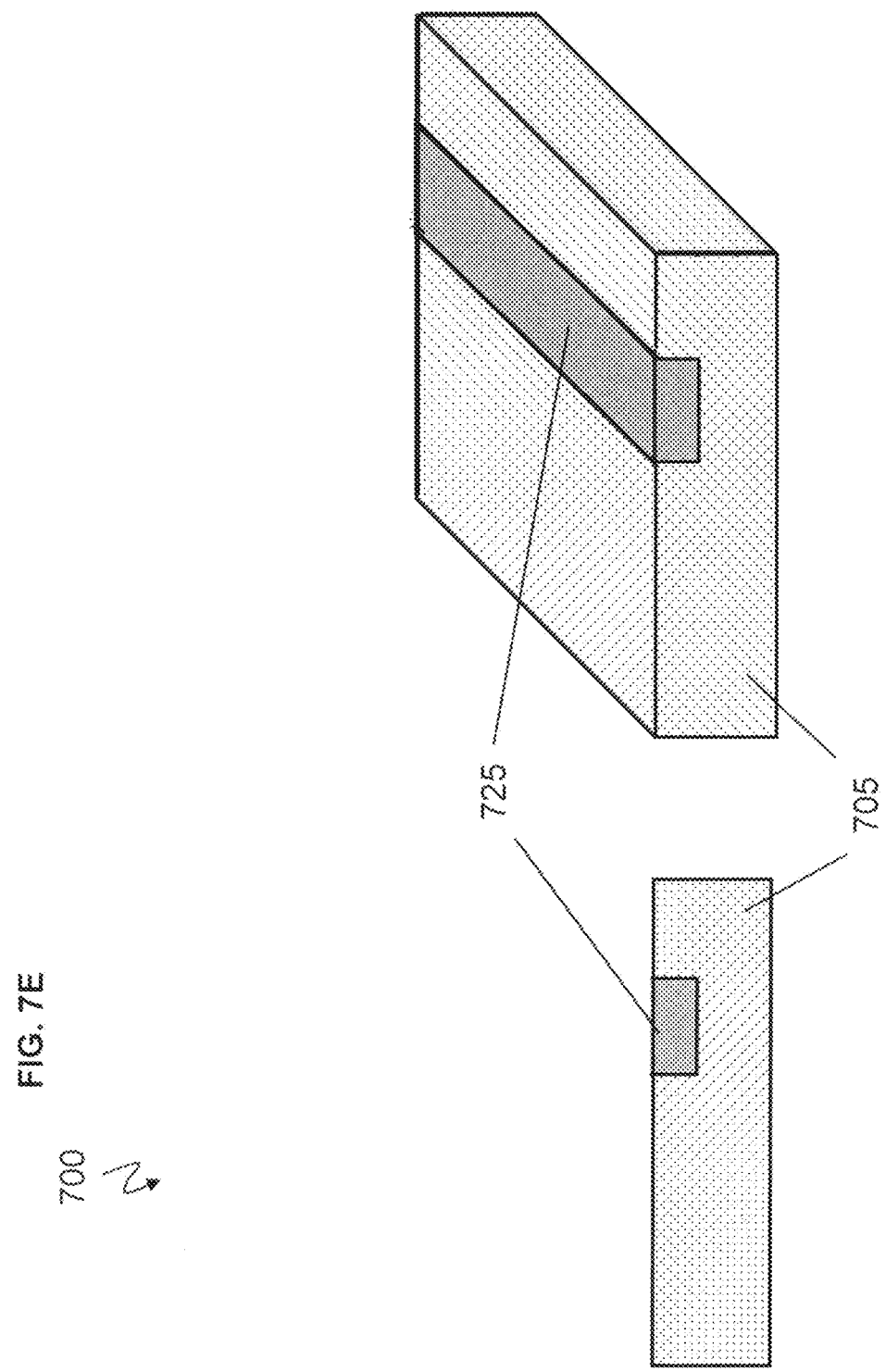

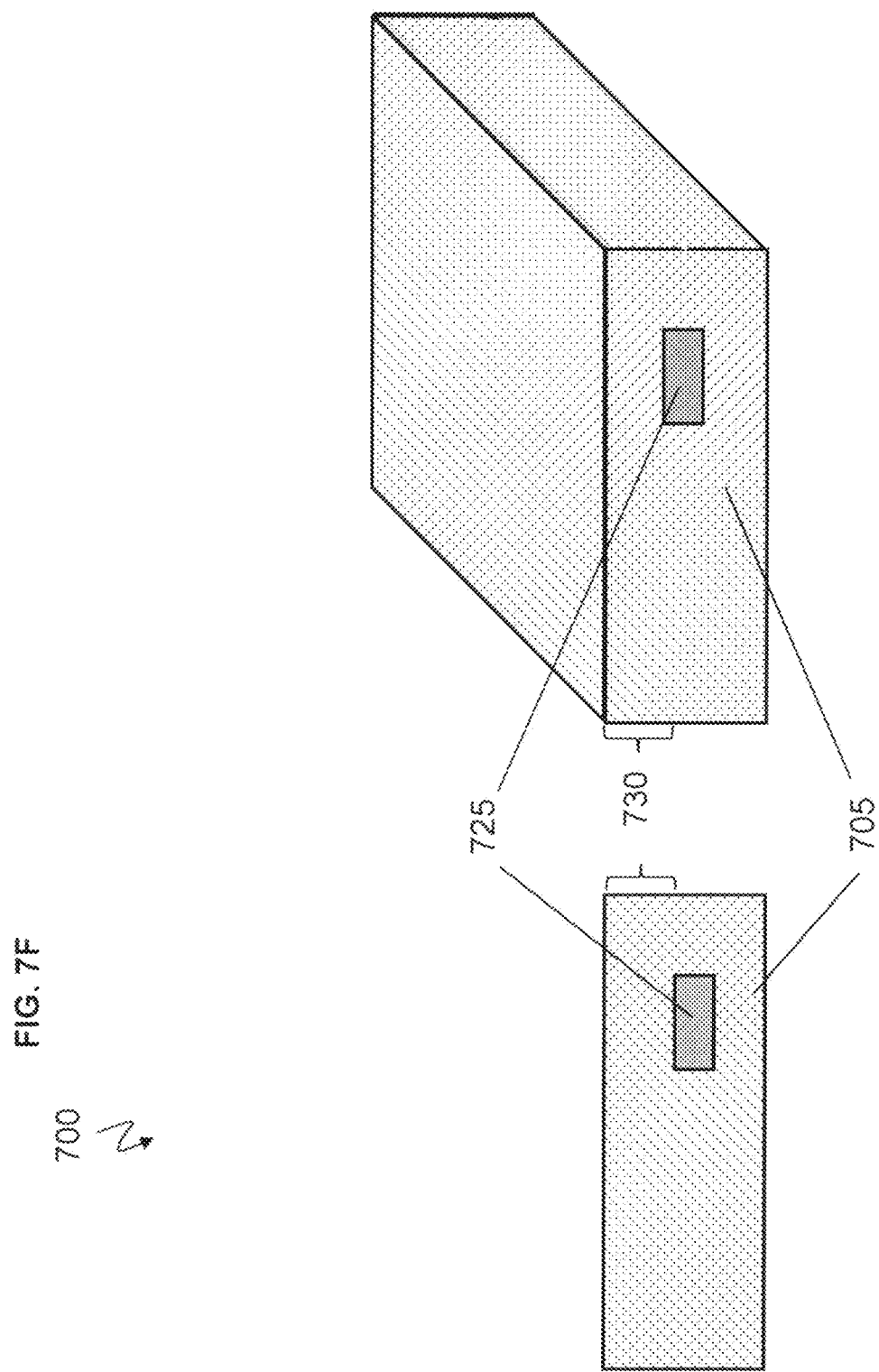

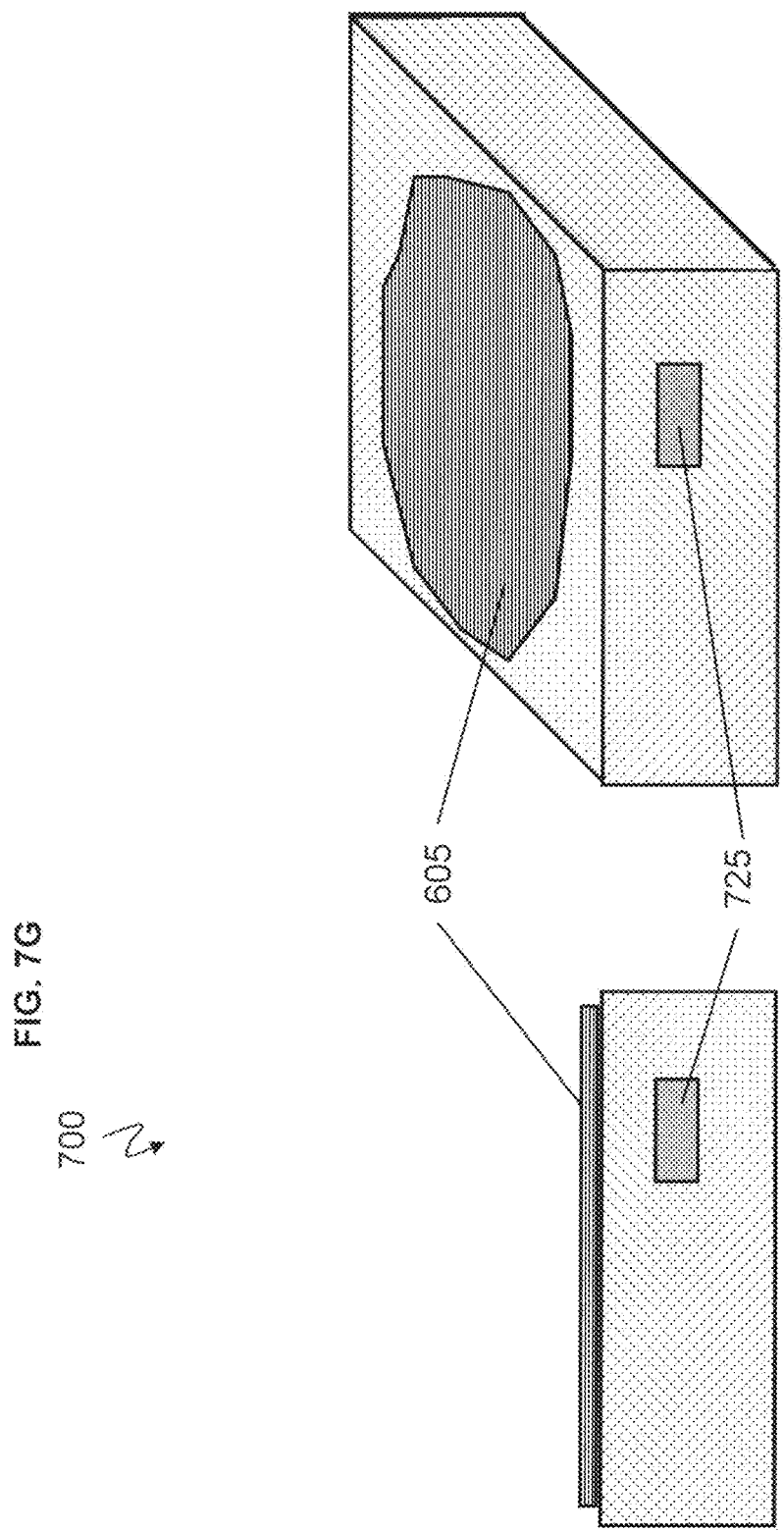

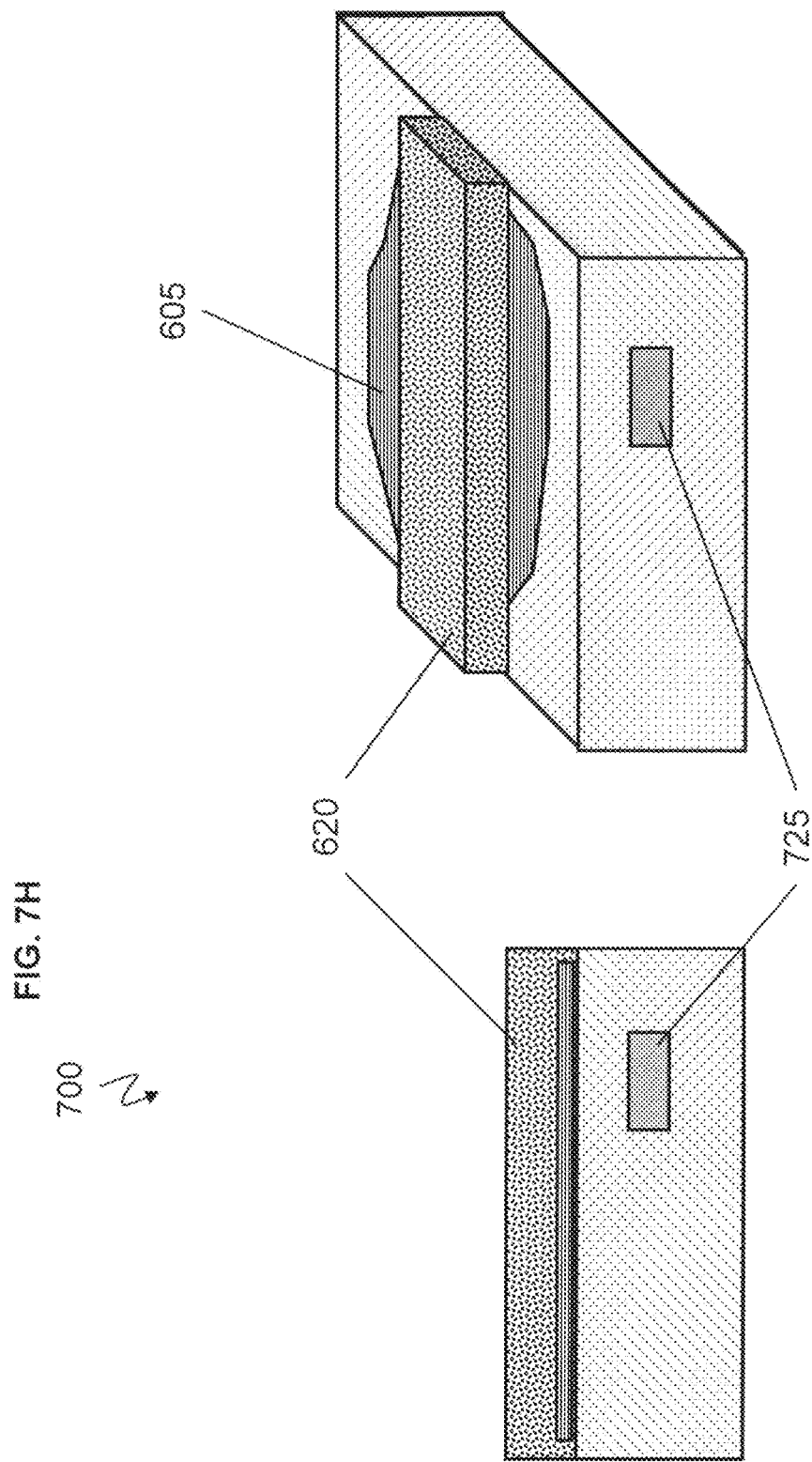

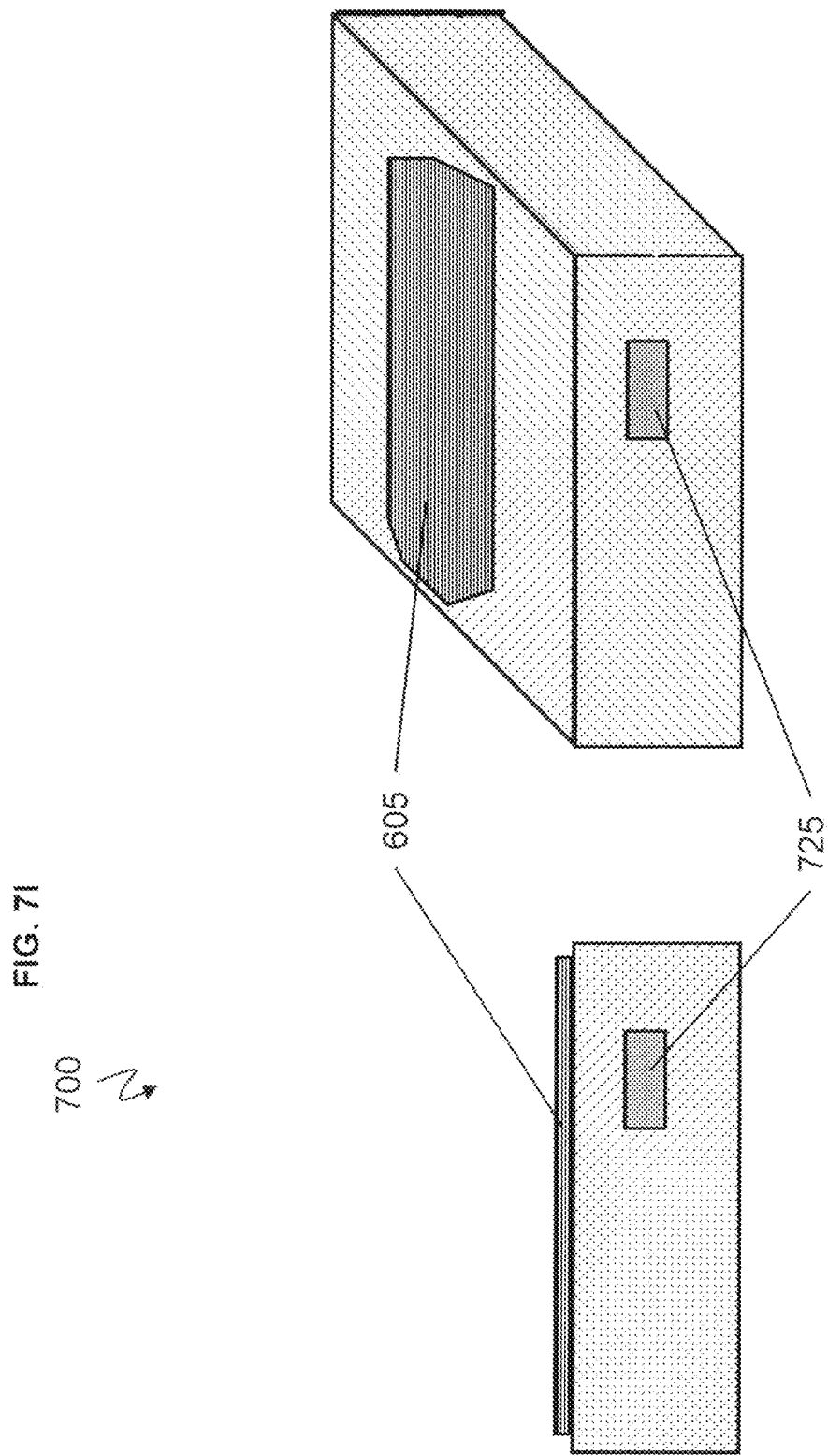

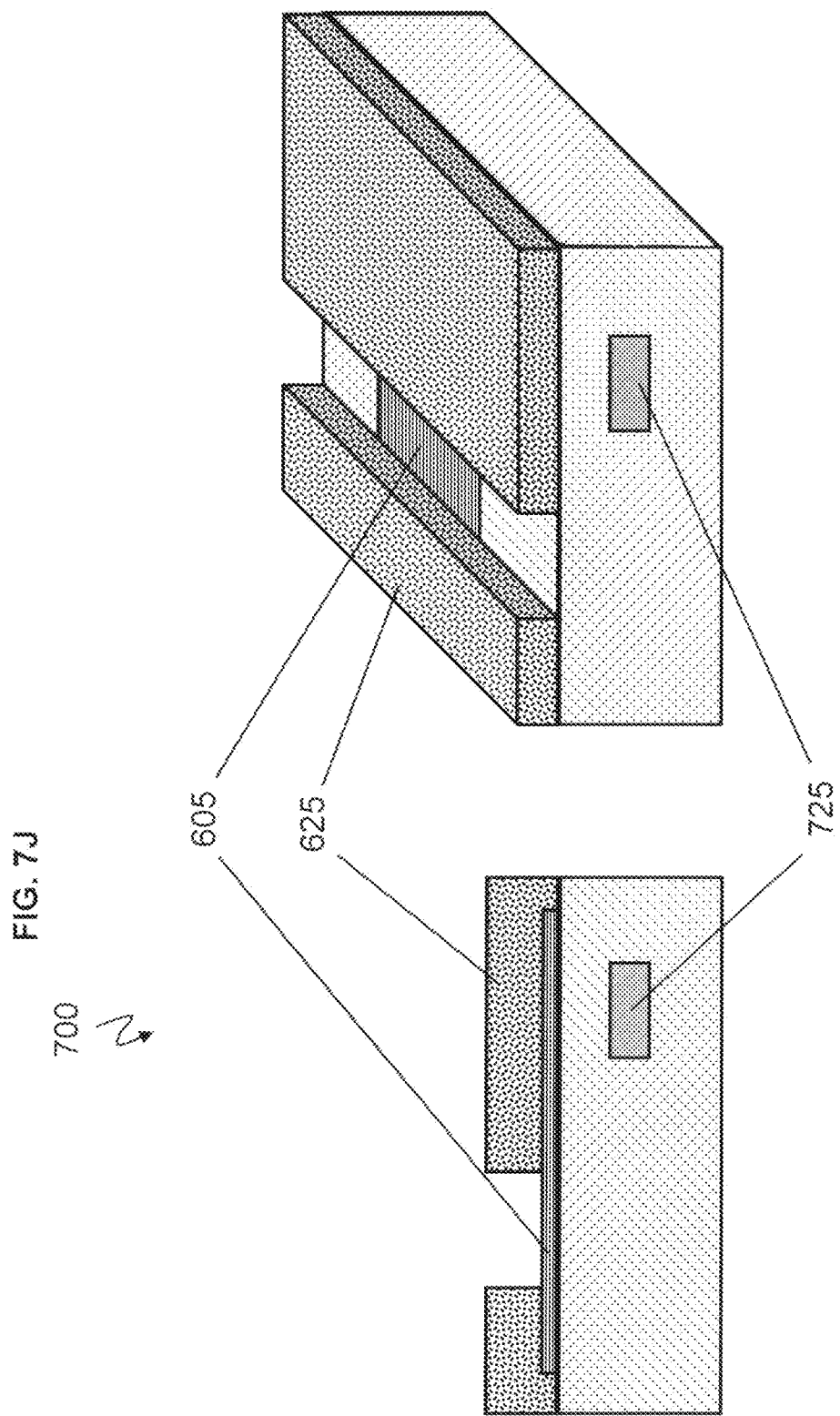

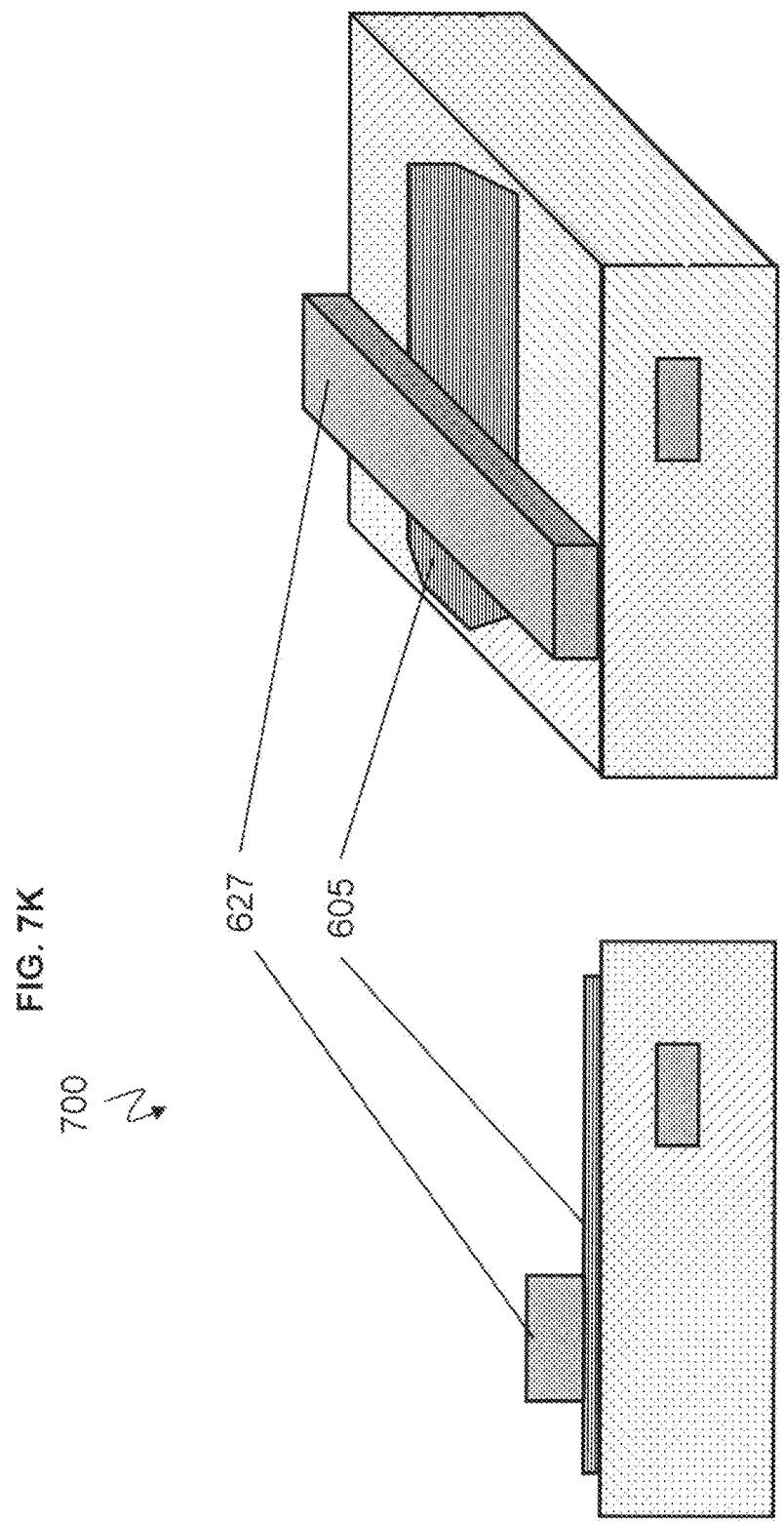

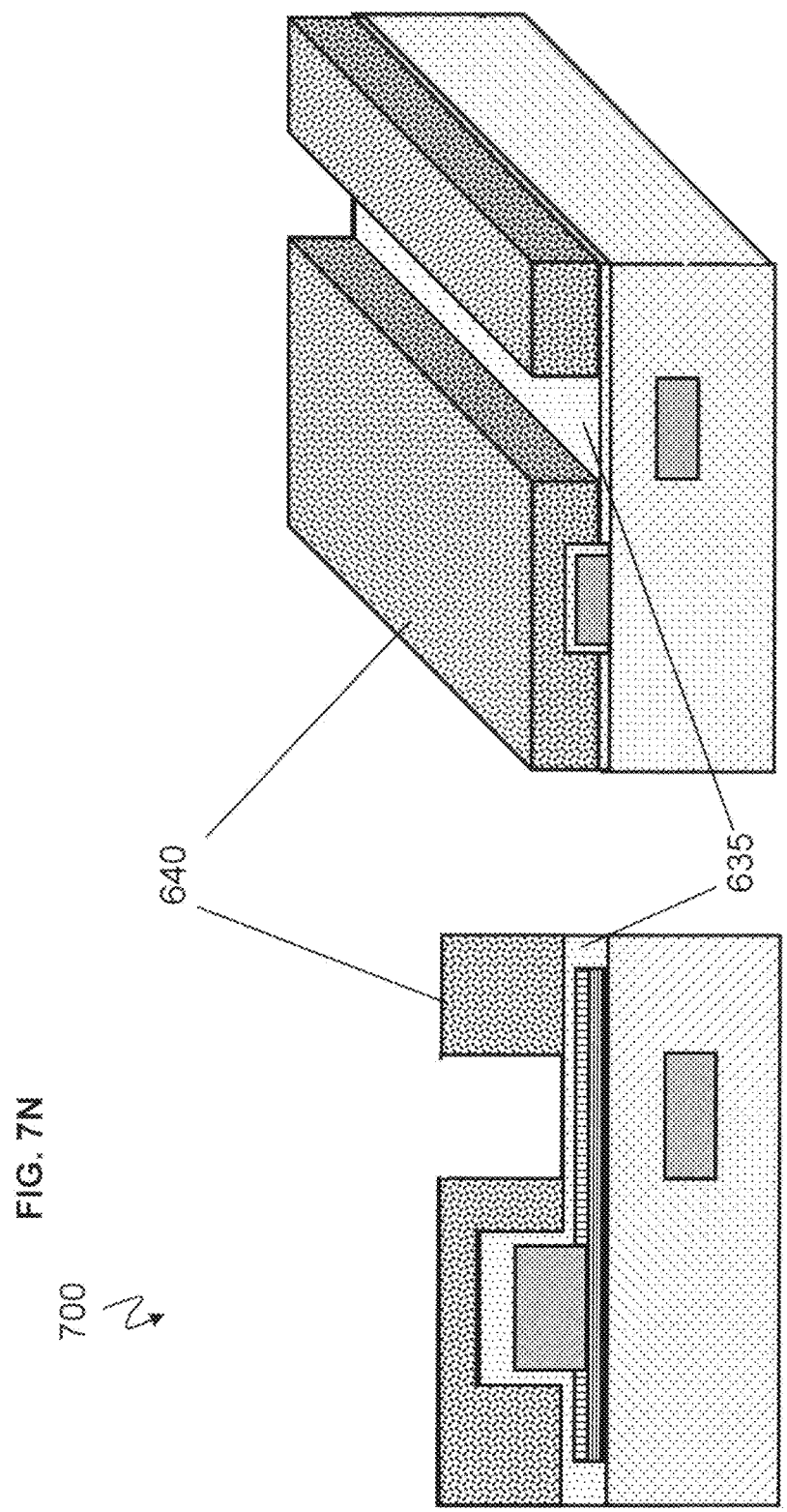

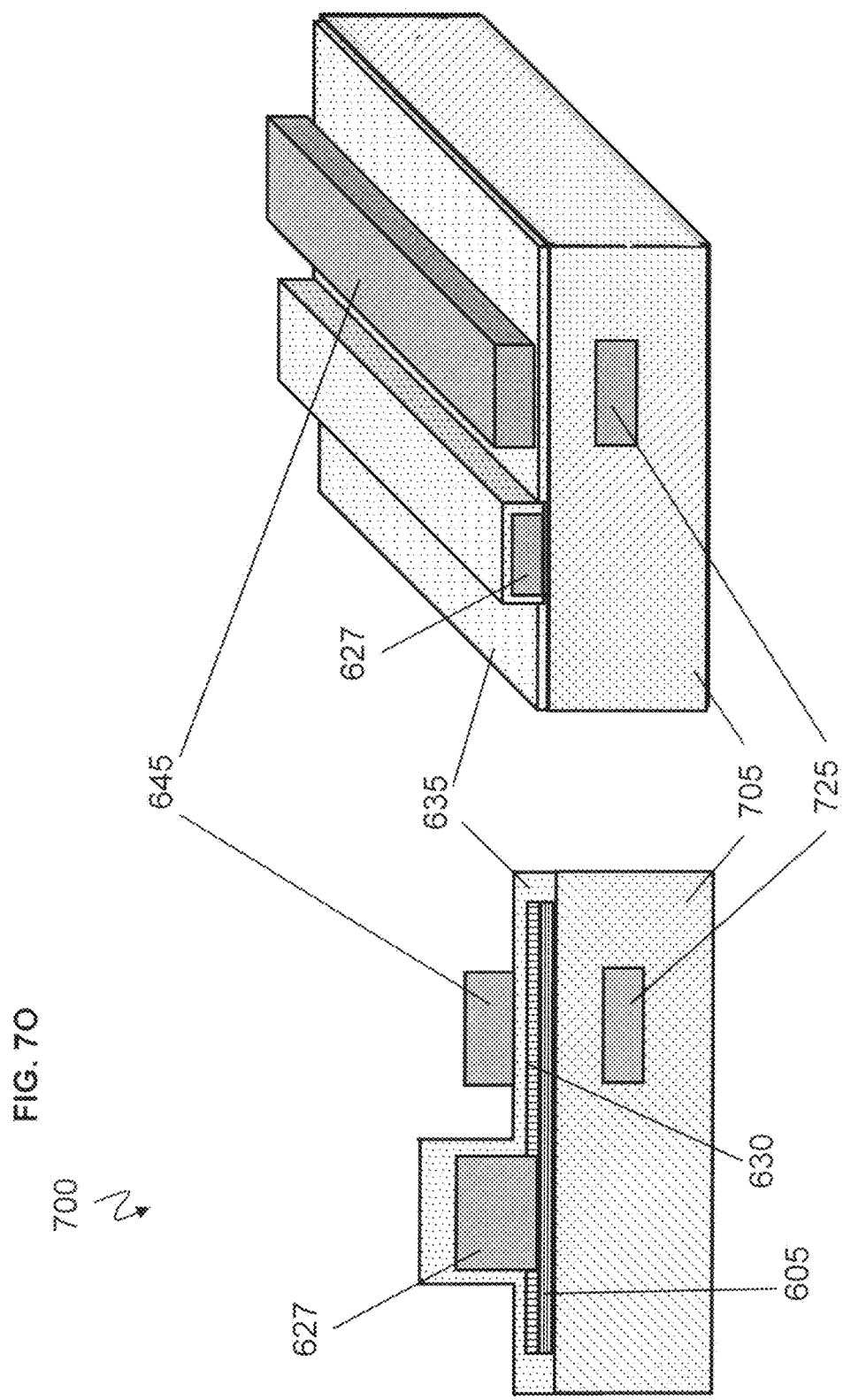

800

- Form a gate dielectric on a gate electrode  805
- Embed a gate electrode in a gate dielectric  810
- Form a graphene electrode on the gate dielectric  815
- Forming a tunnel dielectric on the graphene electrode  820
- Form a tunnel electrode on the tunnel dielectric  825

GATE TUNABLE TUNNEL DIODE

DOMESTIC PRIORITY

This application is a continuation of and claims priority from U.S. application Ser. No. 13/597,610 filed Aug. 29, 2012 which is a continuation of and claims priority from U.S. application Ser. No. 13/594,037 filed Aug. 24, 2012, the entire contents of which are being incorporated herein by reference.

BACKGROUND

The present invention relates to diodes, and more specifically, to gate tunable diodes via an electric field.

Diodes are constructed from the same type of silicon as transistors, but they are simpler devices that have only two terminals. Called the anode and cathode, the two ends of the diode are constructed of positively doped silicon (the anode) joined directly to negatively doped silicon (the cathode). This p-n junction exhibits the unique characteristic of allowing current to flow in only one direction (from the anode to the cathode). Diodes have a minimum threshold voltage (Vth or Vt), usually around 0.7 V (volts)) that must be present between the anode and cathode in order for current to flow. If the anode voltage is not at least Vt greater than the cathode voltage, no current will flow. Likewise, if the cathode voltage is greater than the anode voltage, the diode is said to be reverse-biased and no current will flow. In an ideal diode, if the diode voltage equals the threshold voltage (plus a small amount), then unlimited current can flow without causing the voltage across the diode to increase. If the diode is reversed-biased, no current will flow regardless of the reverse-voltage magnitude.

SUMMARY

According to an embodiment, a method for configuring a gate tunable diode is provided. The method includes forming a gate dielectric on a gate electrode and forming a graphene electrode on the gate dielectric. The method includes forming a tunnel dielectric on the graphene electrode and forming a tunnel electrode on the tunnel dielectric.

According to an embodiment, a method for configuring a gate tunable diode is provided. The method includes embedding a gate electrode in a gate dielectric and forming a graphene electrode on the gate dielectric. Also, the method includes forming a tunnel dielectric on the graphene electrode and forming a tunnel electrode on the tunnel dielectric.

According to an embodiment, a gate tunable diode is provided. The gate tunable diode includes a gate dielectric formed on a gate electrode and a graphene electrode formed on the gate dielectric. Also, the gate tunable diode includes a tunnel dielectric formed on the graphene electrode and a tunnel electrode formed on the tunnel dielectric.

According to an embodiment, a gate tunable diode is provided. The gate tunable diode includes a gate electrode embedded in a gate dielectric and a graphene electrode formed on the gate dielectric. Also, the gate tunable diode includes a tunnel dielectric formed on the graphene electrode and a tunnel electrode formed on the tunnel dielectric.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 6A through 6I illustrate a fabrication process of the gate tunable MIM tunnel diode according to an embodiment, in which:

FIG. 6A illustrates graphene mechanically exfoliated, transferred, or epitaxially grown on an insulating gate dielectric;

FIG. 6B illustrates patterning the desired channel region with a resist mask;

FIG. 6C illustrates etching away the exposed graphene;

FIG. 6D illustrates patterning a resist mask for a contact electrode;

FIG. 6E illustrates depositing the contact electrode;

FIG. 6F illustrates optionally functionalizing the graphene layer by depositing a seed layer to promote the uniform deposition of dielectric material in subsequent processes;

FIG. 6G illustrates depositing a thin tunnel dielectric;

FIG. 6H illustrates patterning a resist mask for a tunnel electrode; and

FIG. 6I illustrates depositing the tunnel electrode.

FIGS. 7A through 7O illustrate a fabrication process of the gate tunable MIM tunnel diode according to an embodiment, in which:

FIG. 7A illustrates the insulator of a structure for embedding a gate electrode;

FIG. 7C illustrates etching a trench into the insulator via the patterned mask;

FIG. 7D illustrates two options for depositing metal to be utilized as the gate electrode;

FIG. 7E illustrates making the metal surface flush with the insulator surface to form the embedded gate electrode;

FIG. 7F illustrates depositing a gate dielectric on the surface of the structure;

FIG. 7G illustrates graphene mechanically exfoliated, transferred, or epitaxially grown on an insulating gate dielectric;

FIG. 7H illustrates patterning the desired channel region with a resist mask;

FIG. 7I illustrates etching away the exposed graphene;

FIG. 7J illustrates patterning a resist mask for a contact electrode;

FIG. 7K illustrates depositing the contact electrode;

FIG. 7N illustrates patterning a resist mask for a tunnel electrode; and

FIG. 7O illustrates depositing the tunnel electrode.

DETAILED DESCRIPTION

Figure 1:
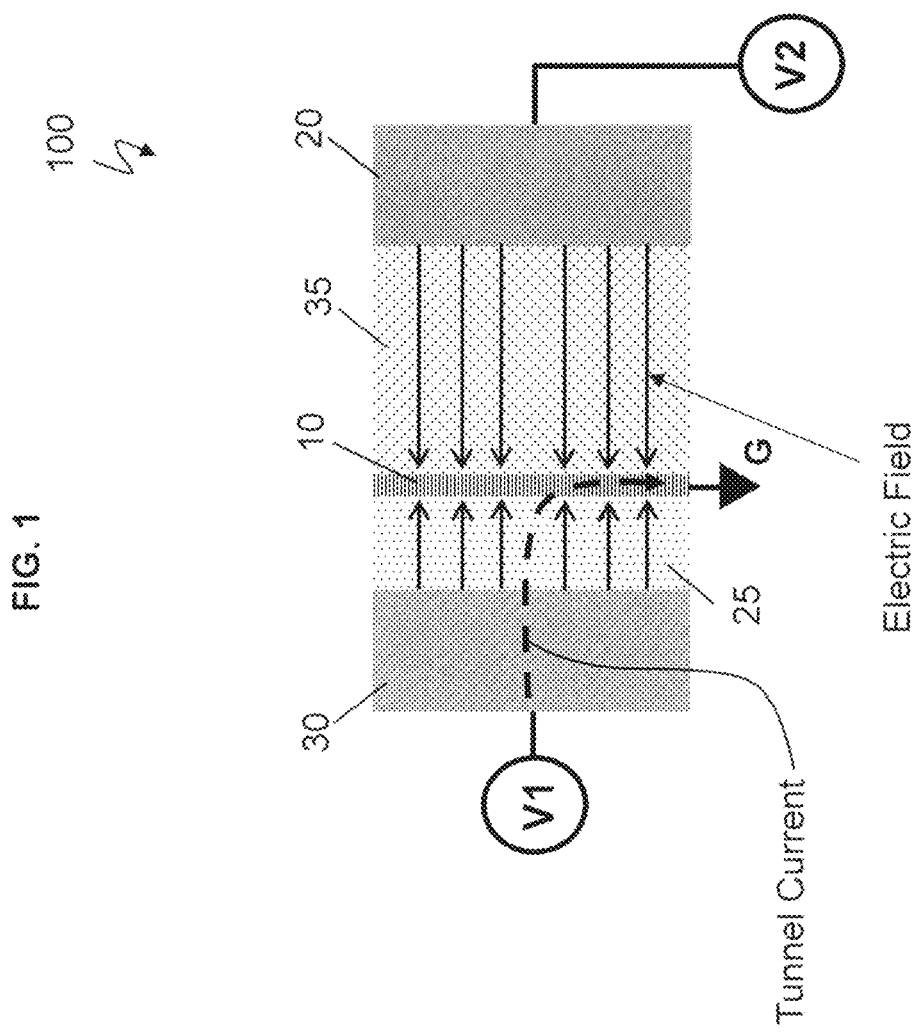
FIG. 1 depicts a gate tunable metal-insulator-metal (MIM) tunnel diode according to an embodiment.

Due to its unique electronic properties, graphene is a material of intense investigation for both scientific and technological applications. Specifically, the high mobility of charge carriers in graphene combined with the ability to modulate the carrier concentration by an external electric field has made graphene-based field-effect transistors (GFETs) promising candidates for future high frequency applications. Alternatively, due to its high conductivity and thinness with a corresponding 97% transparency to optical wavelengths, graphene can also be used as a transparent conducting electrode according to an embodiment. The present disclosure exploits both the FET and electrode attributes of graphene to make a tunneling diode whose threshold voltage (Vt) can be modulated by an external electric field as discussed herein.

Diodes are basic circuit elements, whose rectifying characteristics are utilized to convert oscillating signals into steady, direct current signals. The four basic types of diodes are: p-n diodes, which utilize the potential barrier created at the interface of p-type and n-type semiconductors; Schottky diodes, which exploit barriers between metals and semiconductors; Esaki diodes, which are based on interband tunneling in p-n semiconductor junctions; and metal-insulator-metal diodes (MIM), which are based on tunneling between metal electrodes through an insulator. The oscillating signals that a diode is able to process into direct current signals is limited by the diode's time constant (t), which characterizes the speed of the diode. A diode cannot adequately respond to a frequency that is larger than the inverse of the time constant (1/t), putting a constraint on the operation range of the diode. The time constant is therefore a critical parameter. Of all the diode types, those whose operation relies on tunneling typically have the smallest time constant (t). MIM diodes are the fastest type of tunnel diode because they are not constrained by the relatively low plasma frequencies inherent in semiconductors.

Diodes are typically two-terminal devices, which means that their properties are constant and are not changed by an external, third terminal source. This is because a third terminal source, like an electric field, cannot efficiently modulate the electronic properties of the diode due to screening effects from the bulk materials (metals and semiconductors) that compose the diode. Tunable Schottky diodes have been realized using electrochemical methods to modulate the workfunction, and therefore potential barrier height, of molecular junctions, but the associated time constants prohibit technological significance.

If a tunable Schottky device exploiting the characteristics of graphene/semiconductor junctions were utilized, where barrier modulation is achieved by changing the graphene workfunction with an external third terminal electric field, this would be fabricated to consist of silicon/graphene junctions. However, because these (Schottky) devices utilize a semiconductor (silicon), their operating speed is limited by the semiconductor plasma frequency, and therefore not as fast as a tunneling MIM device. Also, if the tunneling dielectric in MIM diodes is too thin, they will operate via direct tunneling, and as such, do not produce the asymmetric current output required for diode operation. An embodiment outlined herein remedies these problems by using graphene based MIM diodes with tunnel insulators in which the band offsets and thickness of the insulator are designed to facilitate Fowler-Nordheim tunneling instead of direct tunneling, resulting in gate tunable MIM tunnel diodes with highly asymmetric output behavior. For Fowler-Nordheim tunneling, the band offset for the tunnel insulator should be high enough to inhibit thermal excitation of carriers over the barrier, and thick enough to inhibit direct tunneling. An example of this is a band offset of $3k_BT$ and a thickness of 2 nm (nanometers), wherein $k_B$ is Boltzmann's constant and T is temperature.

Now turning to FIG. 1, a depiction of a gate tunable MIM tunnel diode 100 is shown according to an embodiment. Also, the present disclosure provides practical schemes to fabricate the gate tunable MIM tunnel diode 100, and the details of the fabrication process are also discussed herein.

In the gate tunable MIM tunnel diode 100, one of the metal electrodes of the diode is replaced by a graphene electrode 10. The ability to modulate the workfunction of the graphene electrode 10 with the addition of a gate electrode 20 allows for modulation of the diode threshold voltage (Vt).

The graphene electrode 10 is sandwiched between, on one side, a tunnel dielectric 25 and a corresponding tunnel electrode 30, and a gate dielectric 35 and corresponding gate electrode 20 on the other side. The graphene electrode 10, the tunnel dielectric 25, and the tunnel electrode 30 form the diode (i.e., metal insulator graphene (MIG) diode), while the gate dielectric 35 and gate electrode 20 allow the graphene workfunction to be modulated by an electric field. The workfunction of graphene (i.e., the graphene electrode 10), which is intrinsically approximately 4.6 eV (electron volts), can be modulated by establishing a voltage on voltage source V2. This voltage (voltage source V2) induces charge in the gate electrode 20 that in turn creates an electric field that can change the workfunction of graphene (graphene electrode 10) to be less than or greater than 4.6 eV depending on the polarity of the voltage applied to V2.

Figure 2:
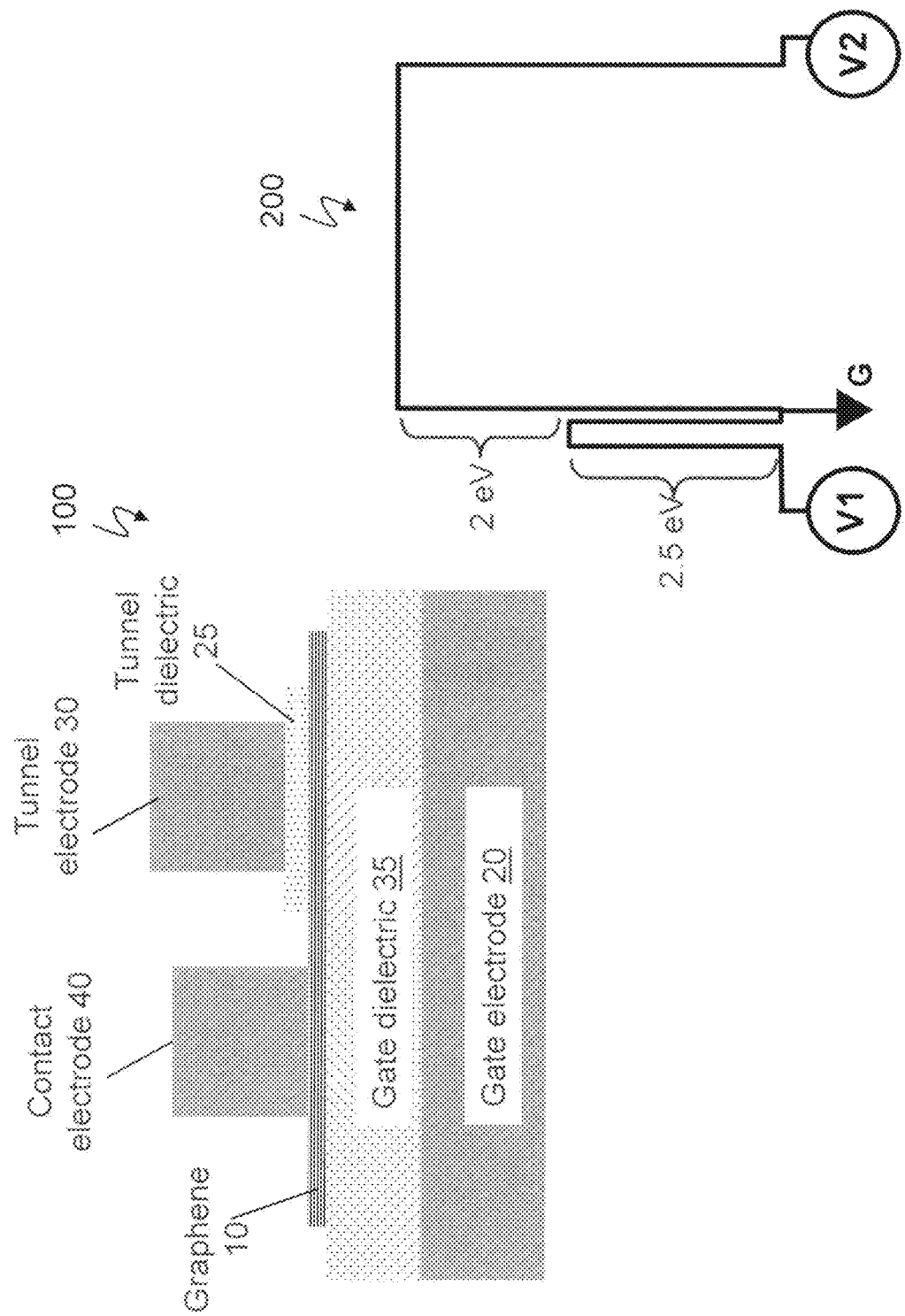
FIG. 2 is a cross-sectional view and an energy band schematic of the gate tunable MIM tunnel diode according to an embodiment.

FIG. 2 is a cross-sectional view of the gate tunable MIM tunnel diode 100 (device) and also shows the contact electrode 40. As can be seen, the gate dielectric 35 is formed on top of the gate electrode 20, and a graphene layer which is the graphene electrode 10. The contact electrode 40 is formed on top of the graphene electrode 10. Also, the tunnel dielectric 25 is formed on top of the graphene electrode 10, and the tunnel electrode 30 is formed on top of the tunnel dielectric 25. Also, note that the gate electrode 20 may be embedded in (i.e., surrounded by) the gate dielectric 35 as discussed in FIG. 7.

The material of the tunnel electrode 30 and the contact electrode 40 may be titanium (Ti), gold (Au), and/or a combination of both. The tunnel electrode 30 may be about 20-100 nm (nanometers) thick and the contact electrode 40 may be about 20-100 nm thick. The tunnel dielectric 25 may be, for example, a layer of $HfO_2$ about 2-4 nm thick. The gate dielectric 35 may be, for example, a layer of $SiO_2$ (e.g., between the graphene electrode 10 and the gate electrode 20) about 10-90 nm thick. The graphene electrode 10 may be exfoliated graphene, for example. In another case, the graphene electrode 10 may be replaced with a graphite electrode (HOPG, highly oriented pyrolytic graphite). The thickness is measured vertically in FIG. 2 and measured horizontally in FIG. 1.

FIG. 2 also illustrates an energy band schematic 200 of the gate tunable MIM tunnel diode 100 which is shown to the right. In the schematic 200 (and also in FIG. 1), the tunnel electrode 30 is connected to a voltage source V1, the graphene electrode 10 is connected to ground G, and the gate electrode 20 is connected to a voltage source V2. The graphene electrode 10 and the contact electrode 40 are at the same ohmic contact (same potential) and thus are both connected to ground G.

The direction of the current flow in the gate tunable MIM tunnel diode 100 depends on whether the voltage polarity (applied by the voltage source V1) on the tunnel electrode 30 is positive or negative. If voltage applied by the voltage source V1 is positive, current will flow from the voltage source V1, through the tunnel electrode 30, through the tunnel dielectric 25, through the graphene electrode 10 (contact electrode 40) and out to the ground G. If voltage applied by the voltage source V1 is negative, current will flow (in the opposite direction) from the ground G, through the graphene electrode 10 (contact electrode 40), through the tunnel dielectric 25, through the tunnel electrode 30, and out to the voltage source V1. In diode operation (in the case of an AC input signal) the polarity of the input voltage (applied by voltage source V1) on the tunnel electrode 30 can oscillate from positive to negative, and therefore the current direction would continuously change. Since the gate tunable MIM tunnel diode 100 gives asymmetric current output, the output current (e.g., from the graphene electrode 10) at one polarity (e.g., positive voltage applied by the voltage source V1 at the tunnel electrode 30) is higher than the output current at the opposite polarity, thus converting the AC voltage input at the tunnel electrode 30 to a DC current output (at the graphene electrode 10).

The voltage at voltage source V2 is applied to the gate electrode 20 to shift the threshold voltage (Vt) of the gate tunable MIM tunnel diode 100. Particularly, by applying the voltage at the voltage source V2 to the gate electrode 20, the gate electrode 20 causes electric field modulation of the tunneling threshold voltage (Vt) due to modulation of the graphene workfunction of the graphene electrode 10.

Figure 3:
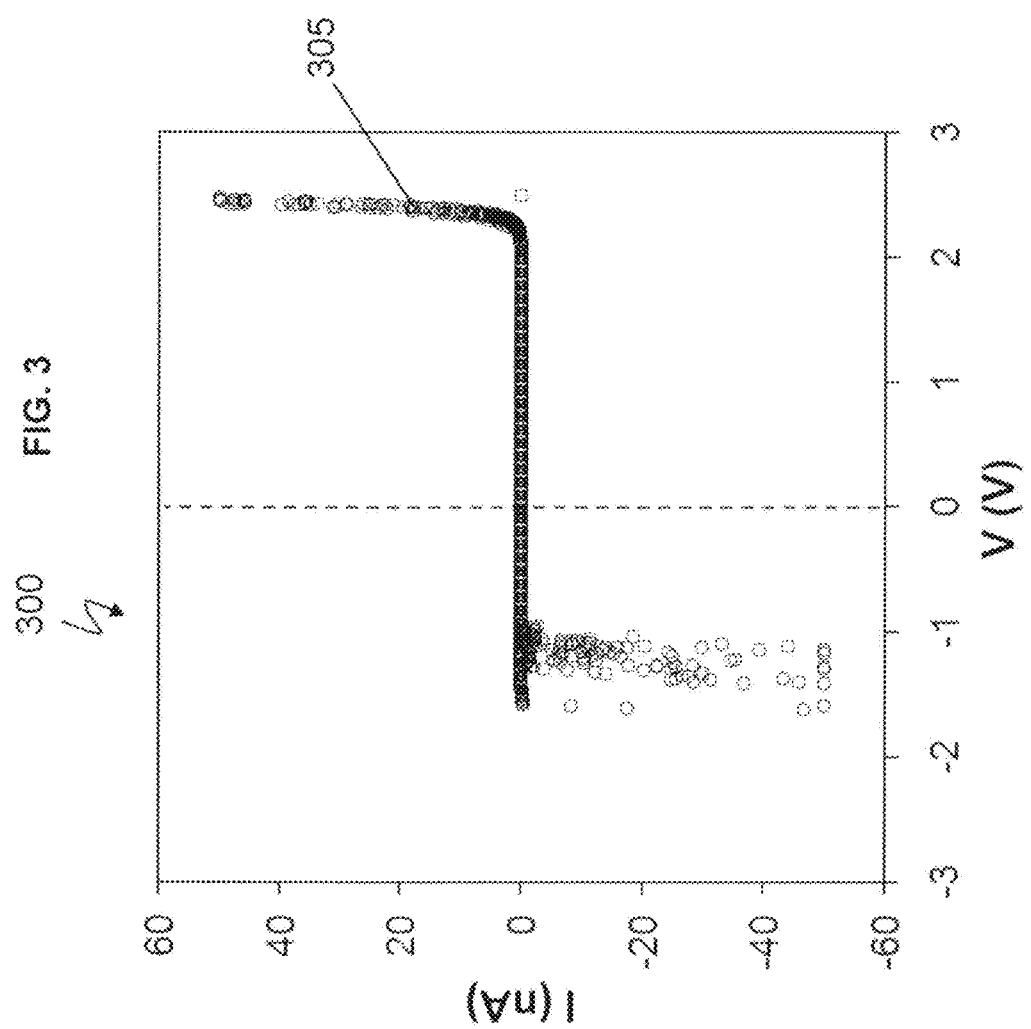
FIG. 3 is a graph of example measurements of a MIM tunnel diode when graphite is utilized according to an embodiment.

FIG. 3 is a plot 300 of example measurements of the gate tunable MIM tunnel diode 100 according to an embodiment. In this example, the graphene electrode 10 is a graphite electrode to form a metal insulator metal device.

By a current-voltage characteristic curve 305, the graph 300 shows that a device (gate tunable MIM tunnel diode 100) with a graphite electrode exhibits pronounced current asymmetry of (approximately) ~1V (volt), which shows a significant intrinsic workfunction mismatch.

Figure 4:
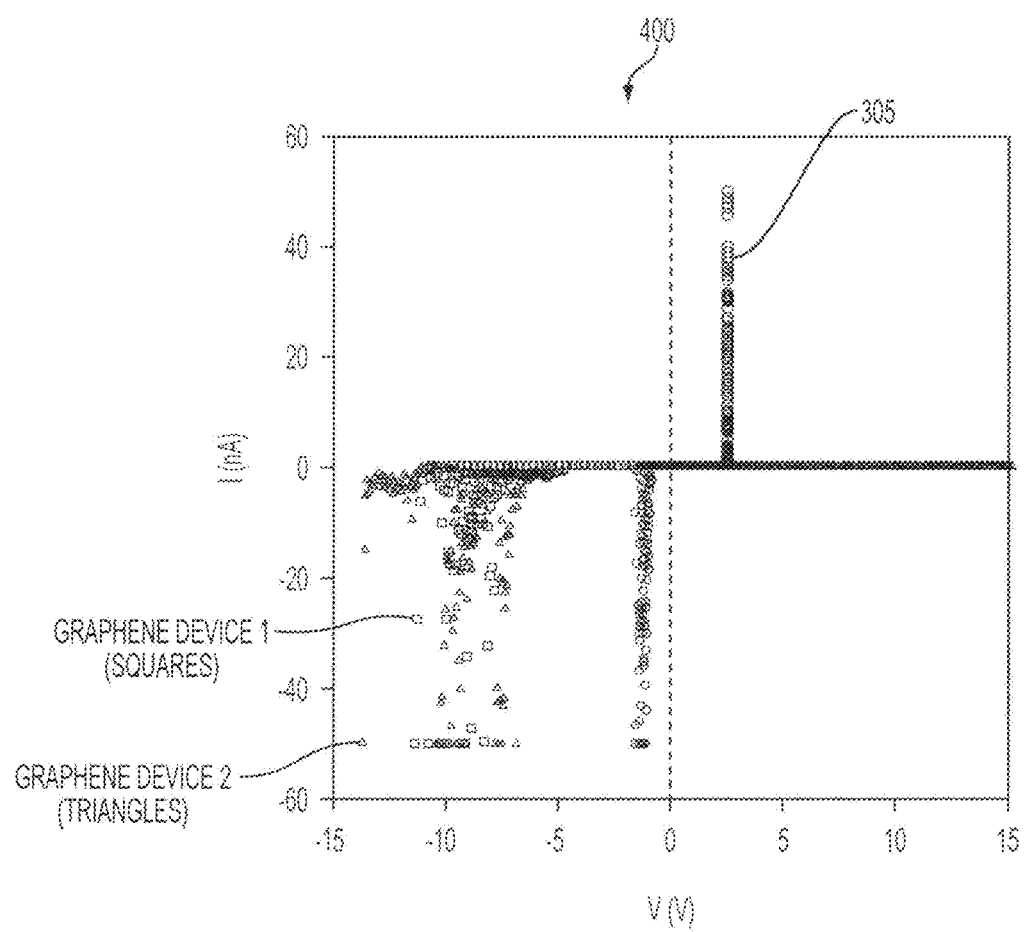
FIG. 4 is a graph of example measurements of the gate tunable MIM tunnel diode when graphene is utilized according to an embodiment.

FIG. 4 is a plot 400 of example measurements of the gate tunable MIM tunnel diode 100 according to an embodiment. When graphene is used as the graphene electrode 10, the asymmetry trend remains and is significantly enhanced >10V (e.g., the threshold voltage can be between −15 V to about −7 V). Despite the high voltage biases, the tunnel dielectric 25 can survive multiple sweeps, meaning that the voltage can be swept from −15 V to +15 V many times and the devices survive these multiple sweeps. The squares represent a graphene device 1 for the gate tunable MIM tunnel diode 100 and triangles represent a graphene device 2 for the gate tunable MIM tunnel diode 100.

Figure 5:
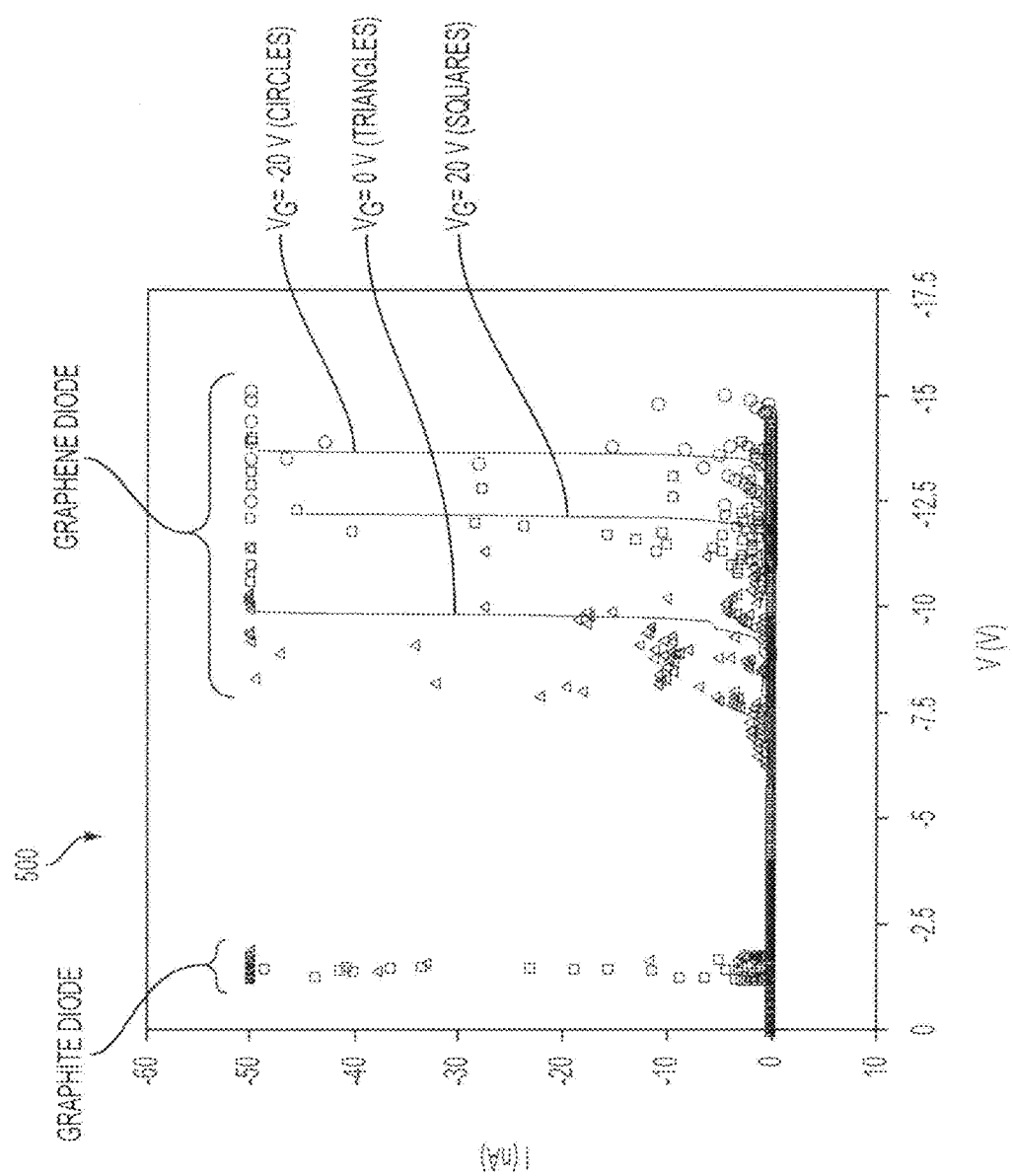
FIG. 5 is a graph of example measurements of the gate tunable MIM tunnel diode with different gate voltages applied to the gate electrode according to an embodiment.

FIG. 5 is a plot 500 of example measurements of the gate tunable MIM tunnel diode 100 with different gate voltages ($V_G$) applied by the voltage source V2 to the gate electrode 20 according to an embodiment.

In the plot 500, the graphite diode (when the gate tunable MIM tunnel diode 100 has a graphite electrode in place of the graphene electrode 10) behaves like a MIM diode and is not modulated by the gate electric field (generated by gate voltage ($V_G$) of the voltage source V2 applied to the gate electrode 20). However, the graphene diode (i.e., the gate tunable MIM tunnel diode 100 with the graphene electrode 10) is tuned by the gate electric field (generated by gate voltage ($V_G$) of the voltage source V2 applied to the gate electrode 20). This tuning is moving the threshold voltage (Vt) along the x-axis.

In the first case, the gate voltage ($V_G$) applied by the voltage source V2 to the gate electrode 20 is −20 volts. Results of applying $V_G$=−20 volts are represented by circles with the average value being a solid line.

In the second case, the gate voltage ($V_G$) applied by the voltage source V2 to the gate electrode 20 is 0 volts. Results of applying $V_G$=0 volts are represented by triangles with the average value being a solid line.

In the third case, the gate voltage ($V_G$) applied by the voltage source V2 to the gate electrode 20 is +20 volts. Results of applying $V_G$=+20 volts are represented by squares with the average value being a solid line.

The y-axis shows the tunnel current and the x-axis shows the threshold voltage (Vt) of the gate tunable MIM tunnel diode 100 when each gate voltage ($V_G$) is applied to the gate electrode 20. As can be seen, the threshold voltage (Vt) of the gate tunable MIM tunnel diode 100 shifts (or is tuned) to the right when the gate voltage ($V_G$) is applied. For example, when the gate voltage ($V_G$) applied to the gate electrode 20 is 0, the threshold voltage (Vt) is approximately −9.5V. When the gate voltage ($V_G$) applied to the gate electrode 20 is −20V, the threshold voltage (Vt) is approximately −12V. When the gate voltage ($V_G$) applied to the gate electrode 20 is 20V, the threshold voltage (Vt) is approximately 13.5V. As can be seen, when modulating the workfunction of the graphene electrode 10 by the applied gate voltage $V_G$ to the gate electrode 20 (generating the electric field), the voltage threshold (Vt) negatively increases as desired. Note that the solid lines represent the average tunnel current. The voltage is negative because this is the "forward-biasing" polarity for this device, where the tunneling current occurs. At positive voltage, the diode is effectively in "reverse-bias" and there is not substantial current. Since the voltage on V1 is negative, electrons are flowing from the tunnel electrode to the graphene (contact electrode), which is grounded. Since current flow is conventionally defined as the flow of positive charge, the current flow is in the opposite direction of the electron flow. Therefore, the current is flowing from the grounded graphene to the tunnel electrode. This gives a negative current value because the current is flowing from the ground instead of to the ground.

Benefits of the gate tunable MIM tunnel diode 100 (device) include but are not limited to:

(1) Fast operation since tunneling is the dominant transport mechanism.

(2) Large output current asymmetry since Fowler-Nordheim tunneling is the dominant tunneling mechanism.

(3) Electric field modulation of the tunneling threshold voltage due to modulation of the graphene workfunction.

(4) Since wafer-scale graphene is available, the fabrication process is a wafer-scale technique.

Wafer-scale means that materials and technology exist to allow for device fabrication on full wafers. These are typically silicon wafers that measure either eight or twelve inches in diameter. The ability to put millions of devices on a single wafer is a cornerstone of the microelectronics industry. Technology does exist to produce graphene of wafer size. Therefore, the present disclosure can be thought of as a wafer-scale technology, in that the technology exists for embodiments to be mass-produced.

In the state of the art, tunable diodes are made in junctions between semiconductors and polymers/nanoparticles. However, these structures require electrochemical gating to modulate the workfunctions of the polymers/nanoparticles, which results in relatively slow frequency operation. Furthermore, these structures employ thermionic (Schottky) emission, a slow process compared to tunneling. The operation frequency of diodes made from junctions with semiconductors are also limited by the plasma frequency of the semiconductor. By completely eliminating semiconductors from the device, MIM diodes can surpass this barrier. Using Schottky diodes with semiconductors like silicon, typical diode operation speed is around 1 THz. Using MIM tunnel diodes where semiconductors are not employed, operating speeds can be greater than 100 THz.

In state of the art, if tunable graphene-based transistors are utilized, these devices are made with exfoliated graphene and boron nitride, not wafer-scalable materials. Also, these devices utilize direct tunneling as opposed to Fowler-Nordheim tunneling, and therefore do not exhibit large current asymmetry that is required for diode operation.

The state of the art can have a graphene-based device structure as a hot-electron bipolar junction transistor, where the graphene is used as the base electrode through which electrons tunnel. However, due to the electrode configuration and band offsets used, the transistor device does not and would not operate as a diode.

Further information regarding fabrication of the gate tunable MIM tunnel diode 100 is discussed below according to embodiments. FIGS. 6A through 6I (generally referred to as FIG. 6) illustrate the fabrication process of the gate tunable MIM tunnel diode 100 according to one embodiment.

In FIG. 6A, graphene 605 (resulting in graphene electrode 10) can be mechanically exfoliated, transferred, or epitaxially grown on an insulating gate dielectric 610 (e.g., resulting in gate dielectric 35) with a (global) bottom gate electrode 615 (resulting in gate electrode 20), which forms structure 600. The graphene 605 is deposited on and/or transferred to the gate dielectric 610 which is supported by the gate electrode 615.

Lithography techniques are then used to define the dimensions of the graphene 605 channel as understood by one skilled in the art. This is done by masking the desired channel region with resist mask 620 (polymethyl methacrylate (PMMA)) in FIG. 6B and then using oxygen plasma to etch the exposed graphene 605 regions. Once the exposed graphene 605 is etched away, the resist mask 620 is then dissolved in FIG. 6C.

A resist mask 625 is then patterned for the contact electrode over the graphene 605 channel by standard lithography techniques in FIG. 6D as understood by one skilled in the art. The contact electrode is patterned onto the graphene surface to facilitate electrical contact to the graphene 605, and the gate metal of the contact electrode 627 (resulting in the contact electrode 40) is deposited in FIG. 6E. Optionally, if needed or desired, the graphene 605 substrate can then be functionalized in order to promote the uniform deposition of dielectric material in subsequent processes as shown in FIG. 6F. Possible functionalization methods include the deposition and oxidation of a thin metal film, coating with a polymer, and/or exposure to a chemical compound like diazonium salt. In the following, the disclosure broadly refers to this initial layer of molecules and/or materials on the graphene surface 605 as the seed layer 630. With the seed layer 630 intact (or without the seed layer 630), the thin tunnel dielectric 635 (resulting in the tunnel dielectric 25) is deposited over the entire substrate/sample (over the entire top of the structure 600) using a conformal deposition technique like atomic layer deposition (ALD) or (chemical vapor deposition) CVD in FIG. 6G.

Using a resist mask 640, the tunnel electrode 645 (resulting in tunnel electrode 30) is then patterned in FIG. 6H and deposited on the substrate surface (structure 600) in FIG. 6I to complete device fabrication of the gate tunable MIM tunnel diode 100. The completed structure 600 is the gate tunable MIM tunnel diode 100 discussed in FIGS. 1 and 2 above.

Figure 7A:
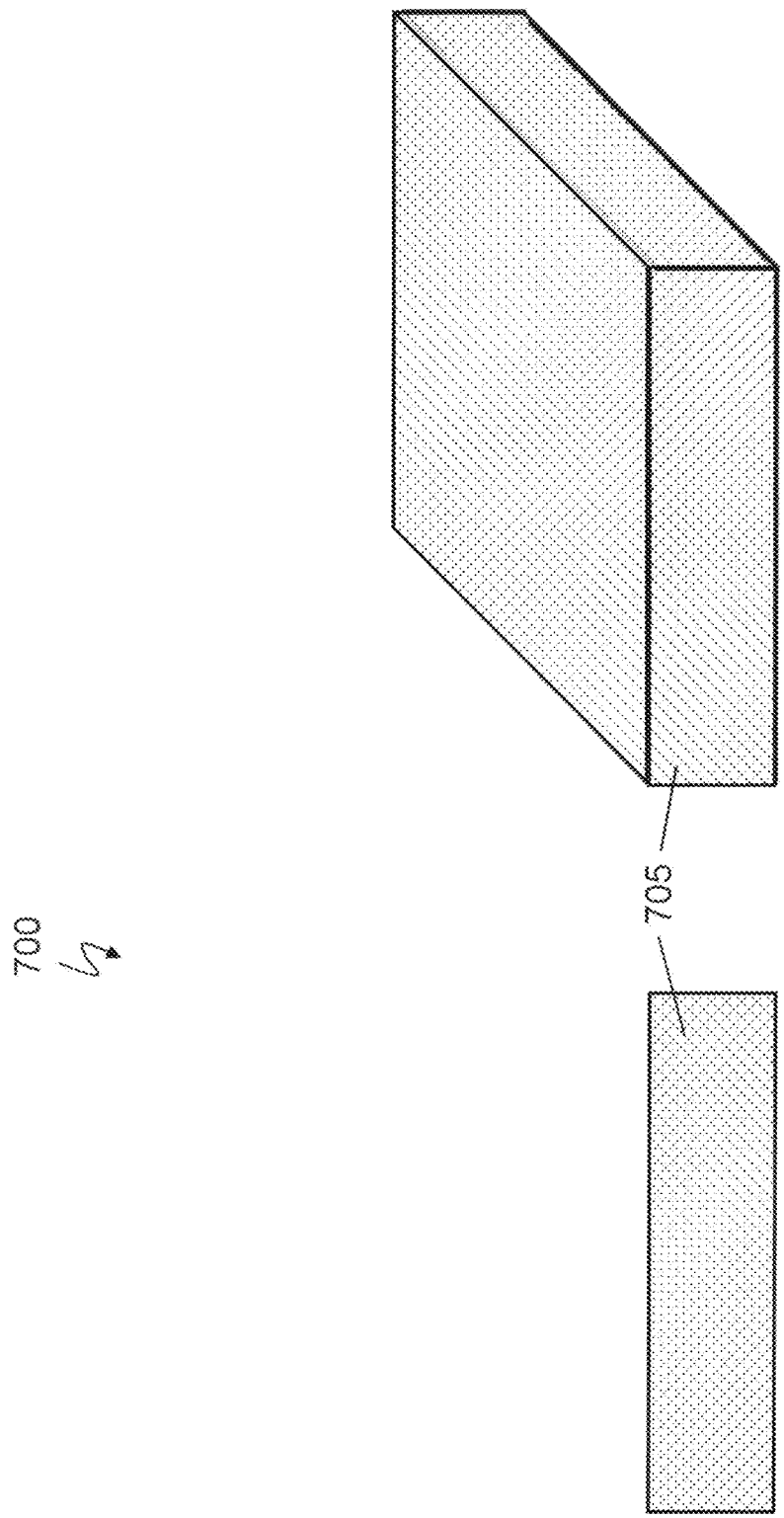

To minimize parasitic capacitance and make the gate electrode 20 and tunnel electrode 30 of equal area, the gate tunable MIM tunnel diode 100 can be constructed on an insulating substrate with embedded gates as illustrated in FIGS. 7A through 7O (generally referred to as FIG. 7). FIG. 7A shows the insulator 705 of a structure 700. The insulator 705 can be silicon carbide, silicon oxide, etc. The insulator 705 results in part of gate dielectric 35 for embedding the gate electrode in this embodiment.

Figure 7B:
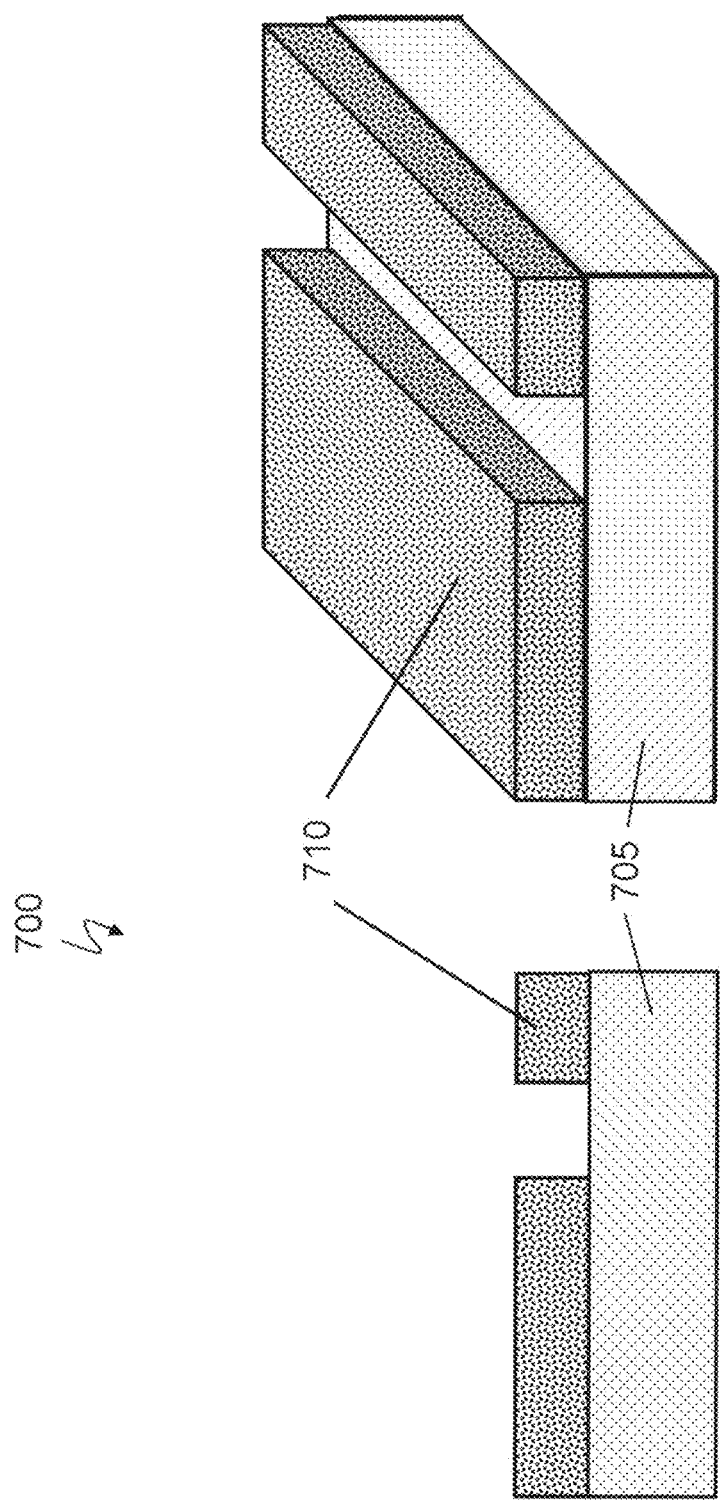
FIG. 7B illustrates patterning a resist mask for the gate electrode.

A resist mask 710 for a gate electrode is patterned by lithography techniques in FIG. 7B. Using the patterned mask 710, a trench 715 is etched into the insulator 705 as shown in FIG. 7C. The insulator 705 surface is exposed in the trench 715 to (subsequently) embed the embedded gate electrode 725.

FIG. 7D shows two options (option 701 and option 702) for depositing metal 720 used for the gate electrode. In option 701, the metal 720 is deposited on the surface of the resist mask 710 for lift-off processing. The metal 720 is also deposited in the trench 715.

In option 702, the resist mask 710 is removed. The metal 720 is instead deposited directly on the surface of the insulator 705 (after removing the resist mask 710) for polishing and planarization.

After lift-off (in option 701) and/or polishing off (in option 702) as understood by one skilled in the art, the metal 720 surface is flush with the insulator 705 surface to form the embedded gate electrode 725 (operating as the gate electrode 20) in FIG. 7E.

In FIG. 7F, the gate dielectric 730 is deposited on the surface of the structure 700 (e.g., deposited on the top of the insulator 705 and the embedded gate electrode 725). The gate dielectric 730 and the insulator 705 may be made of the same material in one case, and may be made of different materials in another case.

The subsequent fabrication processing in FIGS. 7G-7O corresponds to the fabrication processing discussed in FIGS. 6A-6I.

In FIG. 7G, the graphene 605 can be mechanically exfoliated, transferred, or epitaxially grown on the insulating gate dielectric 730 (e.g., resulting in gate dielectric 35). The graphene 605 is deposited on and/or transferred to the gate dielectric 730.

As discussed herein, lithography techniques are then used to define the dimensions of the graphene 605 channel. This is done by masking the desired channel region with resist mask 620 (polymethyl methacrylate (PMMA)) in FIG. 7H and then using oxygen plasma to etch the exposed graphene 605 regions. Once the exposed graphene 605 is etched away, the resist mask 620 is then dissolved in FIG. 7I.

Figure 7L:
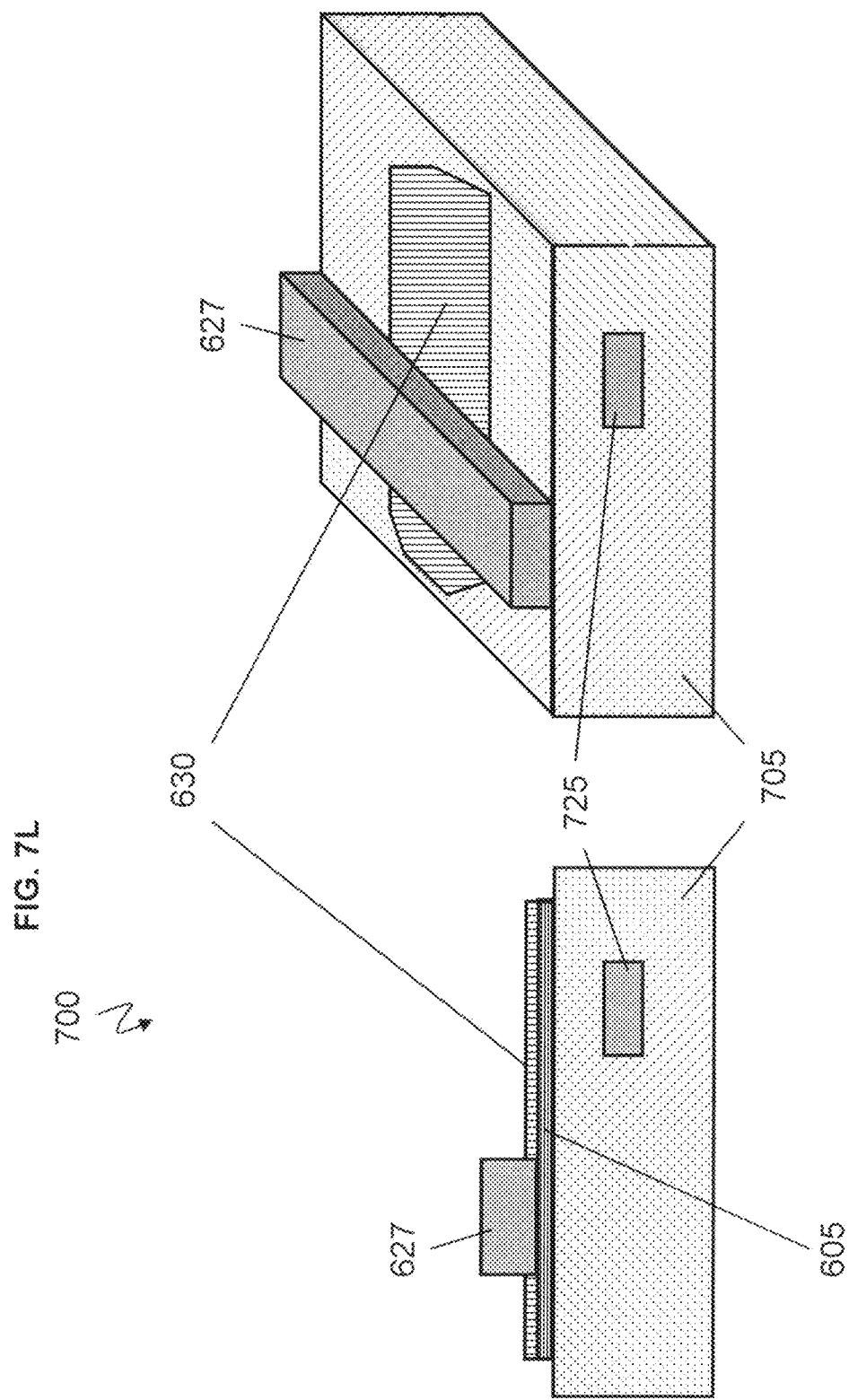
FIG. 7L illustrates optionally functionalizing the graphene layer by depositing a seed layer to promote the uniform deposition of dielectric material in subsequent processes.
Figure 7M:
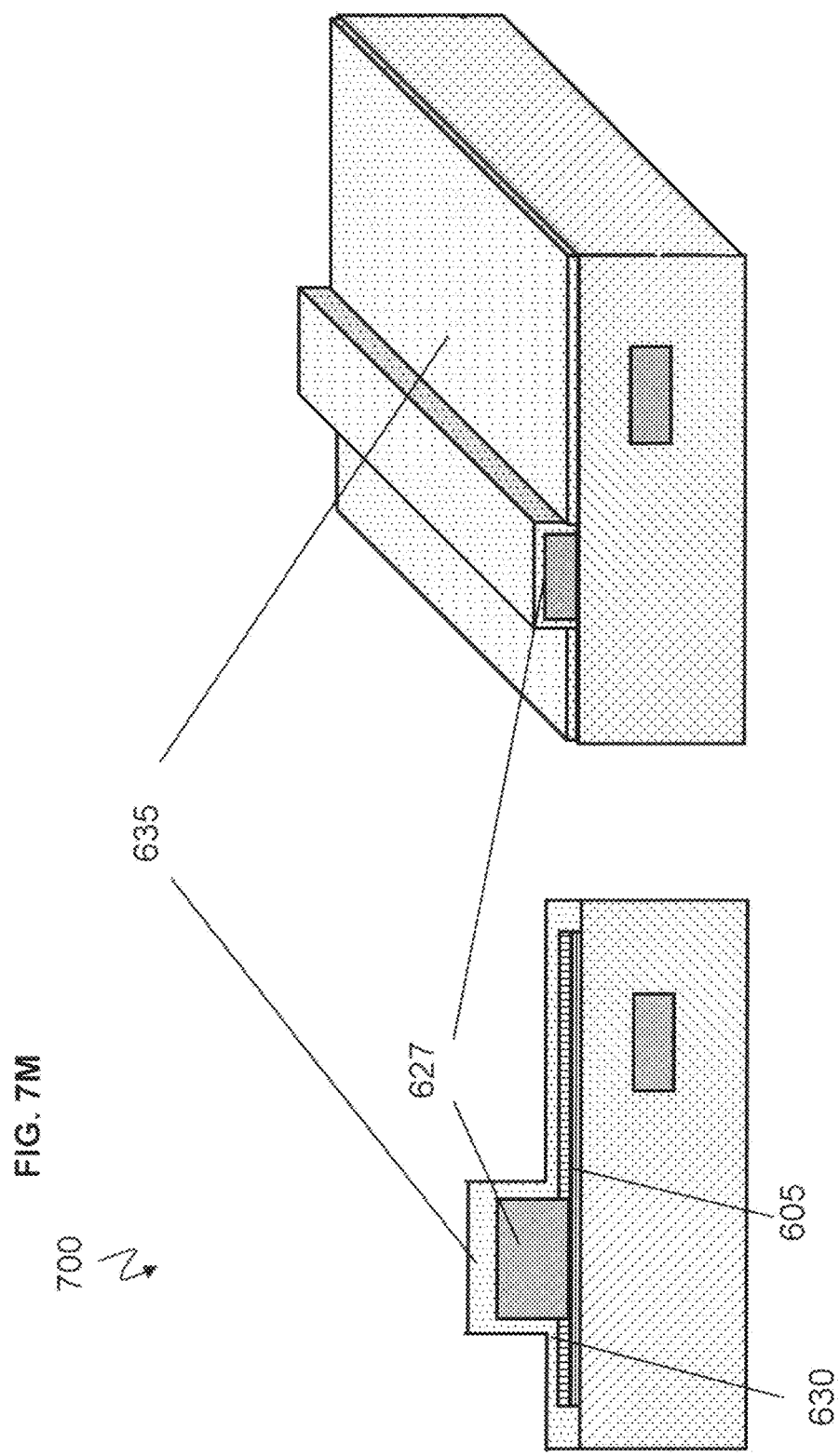
FIG. 7M illustrates depositing a thin tunnel dielectric.

As noted herein, the resist mask 625 patterns the contact electrode over the graphene 605 channel by standard lithography techniques in FIG. 7J. The contact electrode is patterned onto the graphene surface to facilitate electrical contact to the graphene 605, and the gate metal of the contact electrode 627 (resulting in the contact electrode 40) is deposited in FIG. 7K. Optionally, if needed or desired, the graphene 605 substrate can then be functionalized in order to promote the uniform deposition of dielectric material in subsequent processes as shown in FIG. 7L. Possible functionalization methods include the deposition and oxidation of a thin metal film, coating with a polymer, and/or exposure to a chemical compound like diazonium salt. The disclosure broadly refers to this initial layer of molecules and/or materials on the graphene surface 605 as the seed layer 630. With the seed layer 630 intact or without the seed layer 630, the thin tunnel dielectric 635 (resulting in the tunnel dielectric 25) is deposited over the entire substrate/sample (over the entire top of the structure 700) using a conformal deposition technique like atomic layer deposition (ALD) or (chemical vapor deposition) CVD in FIG. 7M.

Again, using a resist mask 640, the tunnel electrode 645 (resulting in tunnel electrode 30) is then patterned in FIG. 7N and deposited on the substrate surface (structure 700) in FIG. 7O to complete device fabrication of the gate tunable MIM tunnel diode 100.

The completed structure 700 is the gate tunable MIM tunnel diode 100 discussed in FIGS. 1 and 2 above, and operates accordingly. Unlike in FIG. 6 (and FIGS. 1 and 2), the gate tunable MIM tunnel diode 100 in FIG. 7 includes the embedded gate electrode 725 as the gate electrode 20.

Figure 8:
FIG. 8 is a method for configuring the gate tunable MIM tunnel diode according to an embodiment.

FIG. 8 is a method 800 for configuring the gate tunable metal-insulator-metal (MIM) (particularly metal insulator graphene (MIG)) tunnel diode 100 according to an embodiment. Reference can be made to FIGS. 1-7.

The gate dielectric 35 is formed on the gate electrode 20 at block 805 and/or the gate electrode 20 (e.g., embedded gate electrode 725) is embedded in the gate dielectric 35 at block 810. The graphene electrode 10 is formed on the gate dielectric 35 at block 815. The tunnel dielectric 25 is formed on the graphene electrode 10 at block 820. The tunnel electrode 30 is formed on the tunnel dielectric 25 at block 825.

Further, the method includes forming a contact electrode 40 on the graphene electrode 10. The method in which a first voltage source (V1) is connected to the tunnel electrode 30 and a second voltage source (V2) is connected to the gate electrode 20. The method in which the graphene electrode 10 is connected to ground (G).

The method in which tunnel current flows in the tunnel electrode 30, the tunnel dielectric 25, and the graphene electrode 10, responsive to a first voltage applied by the first voltage source V1. The method includes causing a modulated threshold voltage (Vt) responsive to a second voltage applied by the second voltage source V2. The method in which the modulated threshold voltage (Vt) is shifted from an initial threshold voltage (e.g., −0.7 V) that is required (to another threshold voltage (such as, e.g., −9.5 V, −12 V, −13.5 V, etc.). The method in which the modulated threshold voltage (e.g., Vt=−9.5) is met to cause the tunnel current to flow in place of meeting the initial/normal threshold voltage (e.g., Vt=−0.7 when no voltage is applied by the voltage source V2). The method in which the modulated threshold voltage is a different value from the initial threshold voltage.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A gate tunable diode, the diode comprising:
   a gate electrode embedded in a gate dielectric;
   a graphene electrode formed on the gate dielectric;
   a tunnel dielectric formed on the graphene electrode; and
   a tunnel electrode formed on the tunnel dielectric.

2. The gate tunable diode of claim 1, further comprising a contact electrode formed on the graphene electrode.

3. The gate tunable diode of claim 1, further comprising a first voltage source connected to the tunnel electrode.

4. The gate tunable diode of claim 3, further comprising a second voltage source connected to the gate electrode.

5. The gate tunable diode of claim 4, further comprising the graphene electrode connected to ground.

6. The gate tunable diode of claim 5, further comprising tunnel current flowing in the tunnel electrode, the tunnel dielectric, and the graphene electrode, responsive to a first voltage applied by the first voltage source.

7. The gate tunable diode of claim 6, further comprising a modulated threshold voltage responsive to a second voltage applied by the second voltage source.

8. The gate tunable diode of claim 7, wherein the modulated threshold voltage is shifted from an initial threshold voltage that is required.

9. The gate tunable diode of claim 7, wherein the modulated threshold voltage is met to cause the tunnel current to flow in place of meeting an initial threshold voltage.

10. The gate tunable diode of claim 8, wherein the modulated threshold voltage is a different value than the initial threshold voltage.

11. A method of configuring a gate tunable diode, the method comprising:
    embedding a gate electrode in a gate dielectric;
    forming a graphene electrode on the gate dielectric;
    forming a tunnel dielectric on the graphene electrode; and
    forming a tunnel electrode on the tunnel dielectric.

12. The method of claim 11, further comprising forming a contact electrode on the graphene electrode.

13. The method of claim 11, wherein a first voltage source is connected to the tunnel electrode.

14. The method of claim 13, wherein a second voltage source is connected to the gate electrode.

15. The method of claim 14, wherein the graphene electrode is connected to ground.

16. The method of claim 15, wherein tunnel current flows in the tunnel electrode, the tunnel dielectric, and the graphene electrode, responsive to a first voltage applied by the first voltage source.

17. The method of claim 16, further comprising causing a modulated threshold voltage responsive to a second voltage applied by the second voltage source.

18. The method of claim 17, wherein the modulated threshold voltage is shifted from an initial threshold voltage that is required.

19. The method of claim 17, wherein the modulated threshold voltage is met to cause the tunnel current to flow in place of meeting an initial threshold voltage.

20. The method of claim 18, wherein the modulated threshold voltage is a different value than the initial threshold voltage.

\* \* \* \* \*